United States Patent
Kandanarachch et al.

(10) Patent No.: US 10,915,019 B2
(45) Date of Patent: Feb. 9, 2021

(54) PHOTOSENSITIVE COMPOSITIONS, COLOR FILTER AND MICROLENS DERIVED THEREFROM

(71) Applicant: PROMERUS, LLC, Brecksville, OH (US)

(72) Inventors: Pramod F Kandanarachch, Brecksville, OH (US); Hongshi Zhen, Brecksville, OH (US); Larry F Rhodes, Brecksville, OH (US)

(73) Assignee: PROMERUS, LLC, Akron, OH (US)

( * ) Notice: Subject to any disclaimer, the term of this patent is extended or adjusted under 35 U.S.C. 154(b) by 232 days.

(21) Appl. No.: 15/937,924

(22) Filed: Mar. 28, 2018

(65) Prior Publication Data

US 2018/0284609 A1  Oct. 4, 2018

Related U.S. Application Data

(60) Provisional application No. 62/477,696, filed on Mar. 28, 2017.

(51) Int. Cl.

| | |
|---|---|
| *G03F 7/023* | (2006.01) |
| *G03F 7/038* | (2006.01) |
| *G03F 7/039* | (2006.01) |
| *G03F 7/012* | (2006.01) |
| *G03F 7/00* | (2006.01) |
| *G02B 1/04* | (2006.01) |
| *G03F 7/16* | (2006.01) |
| *G03F 7/20* | (2006.01) |
| *G03F 7/32* | (2006.01) |
| *G03F 7/30* | (2006.01) |
| *G02B 3/00* | (2006.01) |
| *G03F 7/075* | (2006.01) |
| *G03F 7/022* | (2006.01) |
| *G03F 7/40* | (2006.01) |

(52) U.S. Cl.
CPC ........... *G03F 7/0233* (2013.01); *G02B 1/041* (2013.01); *G02B 3/0056* (2013.01); *G03F 7/0007* (2013.01); *G03F 7/0125* (2013.01); *G03F 7/023* (2013.01); *G03F 7/0226* (2013.01); *G03F 7/038* (2013.01); *G03F 7/039* (2013.01); *G03F 7/0395* (2013.01); *G03F 7/0751* (2013.01); *G03F 7/162* (2013.01); *G03F 7/168* (2013.01); *G03F 7/2004* (2013.01); *G03F 7/3085* (2013.01); *G03F 7/322* (2013.01); *G03F 7/40* (2013.01)

(58) Field of Classification Search
CPC ........ G03F 7/0233; G03F 7/40; G03F 7/0395; G03F 7/0226; G03F 7/0751; G03F 7/023; G03F 7/039; G03F 7/038; G03F 7/0125; G03F 7/0007; G03F 7/168; G03F 7/2004; G03F 7/322; G03F 7/3085; G03F 7/162; G02B 1/041; G02B 3/0056
See application file for complete search history.

(56) References Cited

U.S. PATENT DOCUMENTS

| | | | | |
|---|---|---|---|---|
| 4,611,892 A | * | 9/1986 | Kawashima | ............... C08J 7/04 351/159.57 |
| 2016/0327710 A1 | * | 11/2016 | Murakami | ............. G02B 5/223 |

FOREIGN PATENT DOCUMENTS

| | | |
|---|---|---|
| WO | WO2014/052256 A1 | 4/2014 |
| WO | WO2016/109532 A1 | 7/2016 |
| WO | WO2016/175103 A1 | 11/2016 |
| WO | WO2016/194619 A1 | 12/2016 |

OTHER PUBLICATIONS

English translation of WO 2016/194619 A1 obtained from ESPACENET generated Apr. 5, 2020, 35 pages. (Year: 2020).*
Sigma-Aldrich, copper (II) phthalocyanine, 546674, downloaded Apr. 13, 2020 from worldwide web, 5 pages (Year: 2020).*
English translation of WO 2016/16175103 A1 obtained from ESPACENET generated Apr. 5, 2020, 34 pages. (Year: 2020).*
"Copolymer", PAC, 1996, vol. 68, p. 2287 (Glossary of basic terms in polymer science (IUPAC Recommendations 1996)) on p. 2300 obtained from IUPAC GOLD book on world wide web, one page. (Year: 1996).*
"Copper Phthalocyanines", Copper Phthalocyanines Jan. 1, 2005, 16 pages. (Year: 2005).*
Cleaves H.J. (2011) Moiety. In: Gargaud M. et al. (eds) Encyclopedia of Astrobiology. Springer, Berlin, Heidelberg. https://doi.org/10.1007/978-3-642-11274-4_1873, downloaded from world wide web on Nov. 1, 2020, 4 pages. (Year: 2011).*
International Search Report and the Written Opinion of the International Searching Authority in PCT Application No. PCT/US2018/024710, entiled, "Photosensitive Compositions, Color Filter and Microlens Derived Therefrom," filed Mar. 28, 2018.

* cited by examiner

*Primary Examiner* — Cynthia Hamilton
(74) *Attorney, Agent, or Firm* — Balaram Gupta

(57) ABSTRACT

Embodiments in accordance with the present invention encompass self-imagable polymer compositions containing a colorant which are useful for forming films that can be patterned to create structures for color filters and microlens having applications in a variety of microelectronic devices, optoelectronic devices and displays, such as for example image sensors. The compositions of this invention can be tailored to form positive tone images for forming an array of images, which can be thermally transformed into an array of microlens. The images thus formed can then be used in color filter applications.

19 Claims, 4 Drawing Sheets

PHOTOSENSITIVE COMPOSITIONS, COLOR FILTER AND MICROLENS DERIVED THEREFROM

CROSS REFERENCE TO RELATED APPLICATIONS

This application claims the benefit of U.S. Provisional Application No. 62/477,696 filed Mar. 28, 2017, which is incorporated herein by reference in its entirety.

BACKGROUND OF THE INVENTION

Field of the Invention

Embodiments in accordance with the present invention relate generally to photosensitive compositions for forming color filters and microlenses, and more specifically to compositions encompassing polymers derived from olefinic monomers, such as norbornene (NB) and maleic anhydride. The color filters and/or microlens formed in accordance with this invention are useful in fabricating a variety of image and digital sensors.

Description of the Art

Organic polymer materials are increasingly being used in the microelectronics and optoelectronics industries for a variety of applications. For example, the uses for such organic polymer materials include in the fabrication of image sensors and digital sensors, among others. Where such organic polymer materials are photosensitive, thus photoimagable, and offer advantage of reducing the number of processing steps required for forming a plurality of structures required in the fabrication of such devices. Additionally, such organic polymer materials enable the direct adhesive bonding of devices and device components to form various structures. More importantly, certain optical applications require that the organic polymeric material to be transparent in the visible spectral region, i.e., in the wavelength ranging from 400 to 700 nm. In particular, use of such materials is expanding in applications such as image sensors, which are widely used in a variety of camera modules.

A key component of an image sensor is an on-chip color filter, which can help to fabricate a camera featuring high pixel number. On-chip color filter consists of a microlens and color filter. The function of the microlens is to efficiently deliver the light through the color filter to the photo diode and the function of the color filter is to obtain the color information of the light. As the need for higher resolution digital camera is increased the need for smaller size color filter fabrication also increased. More particularly, the devices having a pixel size of less than 1.4 μm requires fabrication of microlens and the color filters that can handle such high resolution. Recently there has been increased interest in developing new materials capable of resolution up to 1.1 μm or even up to 0.5 μm range.

WO2011/129182A1 discloses binder material for forming color filter formed from an addition copolymer obtained from a functionalized norbornene monomer and maleic anhydride. The composition disclosed therein function as a negative tone photoimaging composition which are generally solvent based and are not capable of achieving aforementioned high resolution and leave some residues after imaging and post development. In addition, these compositions are considered to be environmentally unfriendly due to the use of organic solvents and feature various other undesirable properties. WO2016/194619A1 discloses another type of negative tone compositions having certain of the same drawbacks.

Accordingly, there is still a need for organic polymer compositions which can be used for fabrication of such image sensors. More particularly, there is a need for organic polymers which can be used in forming compositions encompassing red, green and blue (RGB) colorants which are capable of forming high resolution color filters and incorporate microlens functionality.

Accordingly, it is an object of this invention to provide organic polymer compositions that are compatible with various colorants used in the fabrication of image sensors that feature high resolution microlens and color filters.

SUMMARY OF THE INVENTION

It has now been found that by employing copolymers of certain norbornene monomers and ring opened maleic anhydride, it is now possible to form compositions containing a variety of colorants where the copolymer exhibits high transparency in the visible spectral region (in the wavelength of 400 to 700 nm) before and after cure and are cost effective to form image sensors. The composition of this invention is tailorable to desired dissolution properties for forming high resolution images. Surprisingly, it has further been found that the compositions of this invention can also be heat treated in such a fashion that the thermal flow properties of the imaged films can be controlled especially for forming microlens.

Accordingly, there is provided a composition encompassing:

a) a polymer having one or more first repeating units represented by formula (IA), said first repeating unit is derived from a monomer of formula (I):

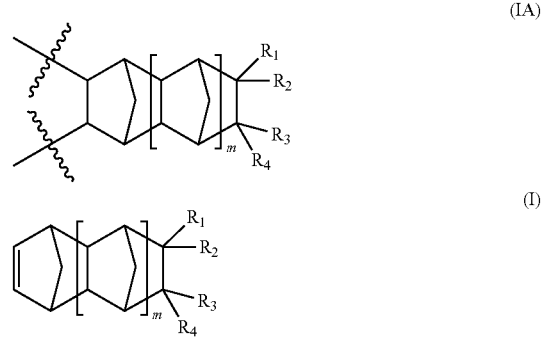

wherein:
m is an integer 0, 1 or 2;
$R_1$, $R_2$, $R_3$ and $R_4$ are the same or different and each independently selected from the group consisting of hydrogen, halogen, linear or branched $(C_1-C_{12})$alkyl, hydroxy$(C_1-C_{12})$alkyl, perfluoro$(C_1-C_{12})$alkyl, $(C_3-C_{12})$cycloalkyl, $(C_6-C_{12})$bicycloalkyl, $(C_7-C_{14})$tricycloalkyl, $(C_6-C_{10})$aryl, $(C_6-C_{10})$aryl$(C_1-C_6)$alkyl, perfluoro$(C_6-C_{10})$aryl, perfluoro$(C_6-C_{10})$aryl$(C_1-C_3)$alkyl, $(C_5-C_{10})$heteroaryl, $(C_5-C_{10})$heteroaryl$(C_1-C_3)$alkyl, hydroxy, $(C_1-C_{12})$alkoxy, $(C_3-C_{12})$cycloalkoxy, $(C_6-C_{12})$bicycloalkoxy, $(C_7-C_{14})$tricycloalkoxy, $(C_6-C_{10})$aryloxy$(C_1-C_3)$alkyl, $(C_5-C_{10})$heteroaryloxy$(C_1-C_3)$alkyl, $(C_6-C_{10})$aryloxy, $(C_5-C_{10})$heteroaryloxy, $(C_1-C_6)$acyloxy, $-(CH_2)_a-C(CF_3)_2OR$, $-(CH_2)_a-CO_2R$, a group of formula (A):

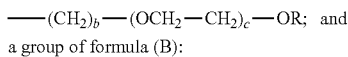  (A)

and a group of formula (B):

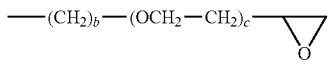  (B)

wherein:
a is an integer from 0 to 4;
b is an integer from 0 to 10;
c is an integer 0, 1, 2, 3 or 4; and
R is selected from the group consisting of hydrogen, linear or branched $(C_1\text{-}C_6)$alkyl, $(C_5\text{-}C_8)$cycloalkyl, $(C_6\text{-}C_{10})$aryl and $(C_7\text{-}C_{12})$aralkyl;
and
one or more of a second repeating unit represented by formula (IIA), said second repeating unit is derived from a monomer of formula (II):

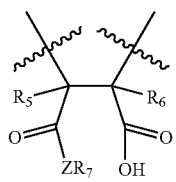  (IIA)

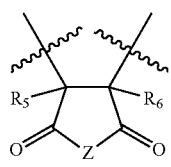  (IIB)

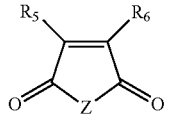  (II)

wherein:
Z is O or N—$R_8$ wherein $R_8$ is selected from the group consisting of hydrogen, linear or branched $(C_1\text{-}C_9)$alkyl, $(C_3\text{-}C_7)$cycloalkyl and $(C_6\text{-}C_{12})$aryl;
$R_5$, $R_6$ and $R_7$ are each independently of one another selected from the group consisting of hydrogen, linear or branched $(C_1\text{-}C_9)$alkyl, fluorinated or perfluorinated$(C_1\text{-}C_9)$ alkyl, $(C_6\text{-}C_{12})$aryl and $(C_6\text{-}C_{12})$aryl$(C_1\text{-}C_{12})$alkyl; and
wherein each of aforementioned groups, where valence is permissible, is optionally substituted with one or more groups selected from the group consisting of linear or branched $(C_1\text{-}C_6)$alkyl, $(C_3\text{-}C_7)$cycloalkyl, $(C_1\text{-}C_6)$perfluoroalkyl, $(C_1\text{-}C_6)$alkoxy, $(C_3\text{-}C_7)$cycloalkoxy, $(C_1\text{-}C_6)$perfluoroalkoxy, halogen, hydroxy, linear or branched hydroxy $(C_1\text{-}C_6)$alkyl, acetoxy, phenyl, hydroxyphenyl and acetoxyphenyl;
b) a colorant selected from red, green, blue, yellow, magenta, black and cyan colored material;
c) a photoactive compound; and
d) a carrier solvent.

BRIEF DESCRIPTION OF THE DRAWINGS

Embodiments in accordance with the present invention are described below with reference to the following accompanying figures and/or images. Where drawings are provided, it will be drawings which are simplified portions of various embodiments of this invention and are provided for illustrative purposes only.

DETAILED DESCRIPTION

Figure 1:
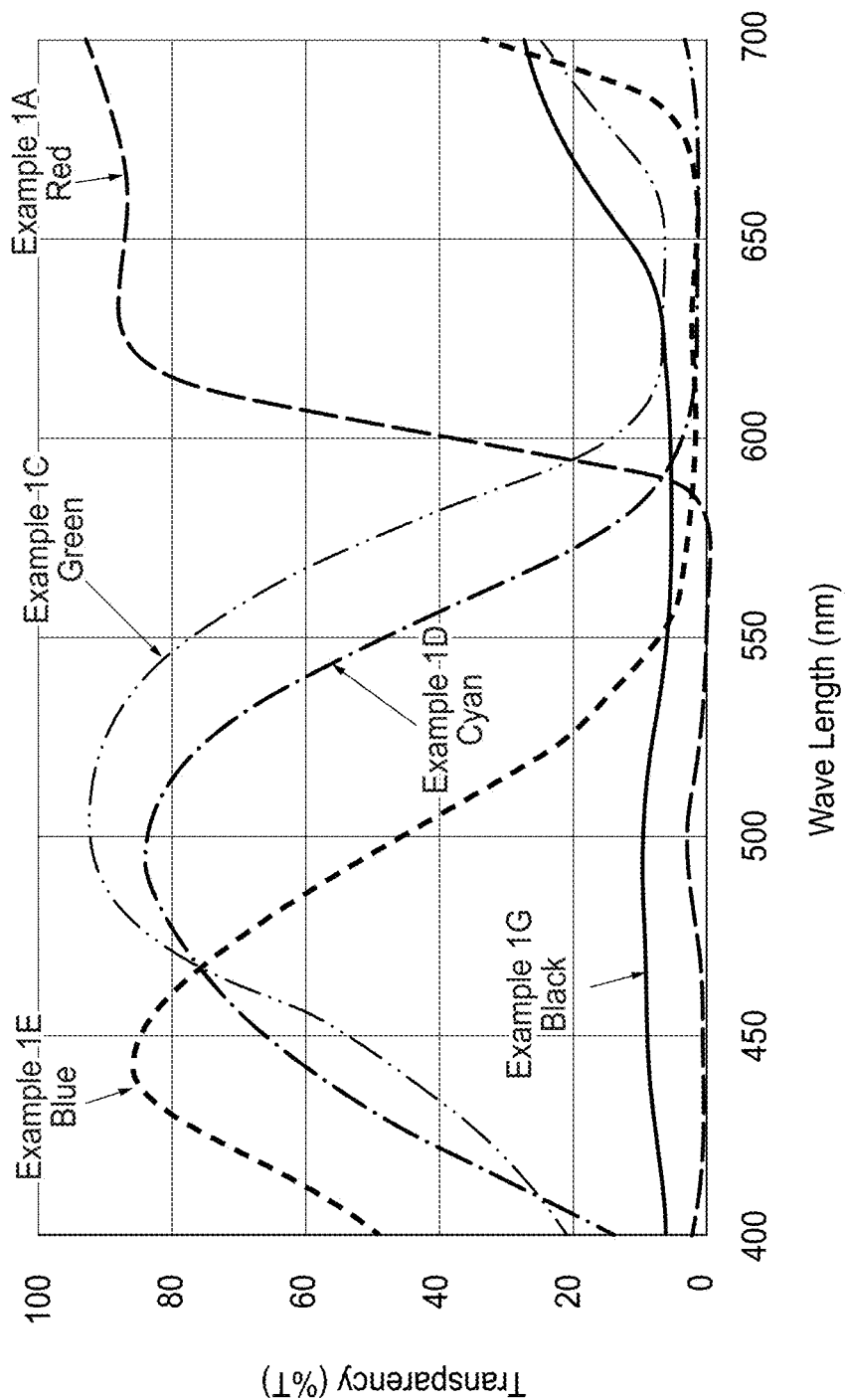
FIG. 1 shows the absorption spectrum of various composition embodiments of this invention.

The terms as used herein have the following meanings:

As used herein, the articles "a," "an," and "the" include plural referents unless otherwise expressly and unequivocally limited to one referent.

Since all numbers, values and/or expressions referring to quantities of ingredients, reaction conditions, etc., used herein and in the claims appended hereto, are subject to the various uncertainties of measurement encountered in obtaining such values, unless otherwise indicated, all are to be understood as modified in all instances by the term "about."

Where a numerical range is disclosed herein such range is continuous, inclusive of both the minimum and maximum values of the range as well as every value between such minimum and maximum values. Still further, where a range refers to integers, every integer between the minimum and maximum values of such range is included. In addition, where multiple ranges are provided to describe a feature or characteristic, such ranges can be combined. That is to say that, unless otherwise indicated, all ranges disclosed herein are to be understood to encompass any and all sub-ranges subsumed therein. For example, a stated range of from "1 to 10" should be considered to include any and all sub-ranges between the minimum value of 1 and the maximum value of 10. Exemplary sub-ranges of the range 1 to 10 include, but are not limited to, 1 to 6.1, 3.5 to 7.8, and 5.5 to 10, etc.

As used herein, the symbol "⁓" denotes a position at which the bonding takes place with another repeat unit or another atom or molecule or group or moiety as appropriate with the structure of the group as shown.

As used herein, "hydrocarbyl" refers to a group that contains carbon and hydrogen atoms, non-limiting examples being alkyl, cycloalkyl, aryl, aralkyl, alkaryl, and alkenyl. The term "halohydrocarbyl" refers to a hydrocarbyl group where at least one hydrogen has been replaced by a halogen. The term perhalocarbyl refers to a hydrocarbyl group where all hydrogens have been replaced by a halogen.

As used herein, the expression "$(C_1\text{-}C_6)$alkyl" includes methyl and ethyl groups, and straight-chained or branched propyl, butyl, pentyl and hexyl groups. Particular alkyl groups are methyl, ethyl, n-propyl, isopropyl and tert-butyl. Derived expressions such as "$(C_1\text{-}C_4)$alkoxy", "$(C_1\text{-}C_4)$ thioalkyl", "(C$_1$-C$_4$)alkoxy(C$_1$-C$_4$)alkyl", "hydroxy(C$_1$-C$_4$) alkyl", "(C$_1$-C$_4$)alkylcarbonyl", "(C$_1$-C$_4$)alkoxycarbonyl (C$_1$-C$_4$)alkyl", "(C$_1$-C$_4$)alkoxycarbonyl", "amino(C$_1$-C$_4$) alkyl", "(C$_1$-C$_4$)alkylamino", "(C$_1$-C$_4$)alkylcarbamoyl(C$_1$-C$_4$)alkyl", "(C$_1$-C$_4$)dialkylcarbamoyl(C$_1$-C$_4$)alkyl", "mono- or di-(C$_1$-C$_4$)alkylamino(C$_1$-C$_4$)alkyl", "amino(C$_1$-C$_4$)alkylcarbonyl", "diphenyl(C$_1$-C$_4$)alkyl", "phenyl(C$_1$-C$_4$)alkyl", "phenylcarboyl(C$_1$-C$_4$)alkyl" and "phenoxy(C$_1$-C$_4$)alkyl" are to be construed accordingly.

As used herein, the expression "cycloalkyl" includes all of the known cyclic groups. Representative examples of "cycloalkyl" includes without any limitation cyclopropyl, cyclobutyl, cyclopentyl, cyclohexyl, cycloheptyl, cyclooctyl, and the like. Derived expressions such as "cycloalkoxy", "cycloalkylalkyl", "cycloalkylaryl", "cycloalkylcarbonyl" are to be construed accordingly.

As used herein, the expression "(C$_2$-C$_6$)alkenyl" includes ethenyl and straight-chained or branched propenyl, butenyl, pentenyl and hexenyl groups. Similarly, the expression "(C$_2$-C$_6$)alkynyl" includes ethynyl and propynyl, and straight-chained or branched butynyl, pentynyl and hexynyl groups.

As used herein the expression "(C$_1$-C$_4$)acyl" shall have the same meaning as "(C$_1$-C$_4$)alkanoyl", which can also be represented structurally as "R—CO—," where R is a (C$_1$-C$_3$)alkyl as defined herein. Additionally, "(C$_1$-C$_3$)alkylcarbonyl" shall mean same as (C$_1$-C$_4$)acyl. Specifically, "(C$_1$-C$_4$)acyl" shall mean formyl, acetyl or ethanoyl, propanoyl, n-butanoyl, etc. Derived expressions such as "(C$_1$-C$_4$)acyloxy" and "(C$_1$-C$_4$)acyloxyalkyl" are to be construed accordingly.

As used herein, the expression "(C$_1$-C$_6$)perfluoroalkyl" means that all of the hydrogen atoms in said alkyl group are replaced with fluorine atoms. Illustrative examples include trifluoromethyl and pentafluoroethyl, and straight-chained or branched heptafluoropropyl, nonafluorobutyl, undecafluoropentyl and tridecafluorohexyl groups. Derived expression, "(C$_1$-C$_6$)perfluoroalkoxy", is to be construed accordingly. It should further be noted that certain of the alkyl groups as described herein, such as for example, "(C$_1$-C$_6$)alkyl" may partially be fluorinated, that is, only portions of the hydrogen atoms in said alkyl group are replaced with fluorine atoms and shall be construed accordingly.

As used herein, the expression "(C$_6$-C$_{10}$)aryl" means substituted or unsubstituted phenyl or naphthyl. Specific examples of substituted phenyl or naphthyl include o-, p-, m-tolyl, 1,2-, 1,3-, 1,4-xylyl, 1-methylnaphthyl, 2-methylnaphthyl, etc. "Substituted phenyl" or "substituted naphthyl" also include any of the possible substituents as further defined herein or one known in the art. Derived expression, "(C$_6$-C$_{10}$)arylsulfonyl," is to be construed accordingly.

As used herein, the expression "(C$_6$-C$_{10}$)aryl(C$_1$-C$_4$)alkyl" means that the (C$_6$-C$_{10}$)aryl as defined herein is further attached to (C$_1$-C$_4$)alkyl as defined herein. Representative examples include benzyl, phenylethyl, 2-phenylpropyl, 1-naphthylmethyl, 2-naphthylmethyl and the like.

As used herein, the expression "heteroaryl" includes all of the known heteroatom containing aromatic radicals. Representative 5-membered heteroaryl radicals include furanyl, thienyl or thiophenyl, pyrrolyl, isopyrrolyl, pyrazolyl, imidazolyl, oxazolyl, thiazolyl, isothiazolyl, and the like. Representative 6-membered heteroaryl radicals include pyridinyl, pyridazinyl, pyrimidinyl, pyrazinyl, triazinyl, and the like radicals. Representative examples of bicyclic heteroaryl radicals include, benzofuranyl, benzothiophenyl, indolyl, quinolinyl, isoquinolinyl, cinnolyl, benzimidazolyl, indazolyl, pyridofuranyl, pyridothienyl, and the like radicals.

As used herein, the expression "heterocycle" includes all of the known reduced heteroatom containing cyclic radicals. Representative 5-membered heterocycle radicals include tetrahydrofuranyl, tetrahydrothiophenyl, pyrrolidinyl, 2-thiazolinyl, tetrahydrothiazolyl, tetrahydrooxazolyl, and the like. Representative 6-membered heterocycle radicals include to piperidinyl, piperazinyl, morpholinyl, thiomorpholinyl, and the like. Various other heterocycle radicals include, without limitation, aziridinyl, azepanyl, diazepanyl, diazabicyclo[2.2.1]hept-2-yl, and triazocanyl, and the like.

"Halogen" or "halo" means chloro, fluoro, bromo, and iodo.

In a broad sense, the term "substituted" is contemplated to include all permissible substituents of organic compounds. In a few of the specific embodiments as disclosed herein, the term "substituted" means substituted with one or more substituents independently selected from the group consisting of (C$_1$-C$_6$)alkyl, (C$_2$-C$_6$)alkenyl, (C$_1$-C$_6$)perfluoroalkyl, phenyl, hydroxy, —CO$_2$H, an ester, an amide, (C$_1$-C$_6$) alkoxy, (C$_1$-C$_6$)thioalkyl, (C$_1$-C$_6$)perfluoroalkoxy, —NH$_2$, Cl, Br, I, F, —NH-lower alkyl, and —N(lower alkyl)$_2$. However, any of the other suitable substituents known to one skilled in the art can also be used in these embodiments.

It should be noted that any atom with unsatisfied valences in the text, schemes, examples and tables herein is assumed to have the appropriate number of hydrogen atom(s) to satisfy such valences.

As used herein, the terms "polymer composition," "copolymer composition," "terpolymer composition" or "tetrapolymer composition" are used herein interchangeably and are meant to include at least one synthesized polymer, copolymer, terpolymer or tetrapolymer, as well as residues from initiators, solvents or other elements attendant to the synthesis of such polymers, where such residues are understood as not necessarily being covalently incorporated thereto. But some catalysts or initiators may sometimes be covalently bound to a part of the polymeric chain either at the beginning and/or end of the polymeric chain. Such residues and other elements considered as part of the "polymer" or "polymer composition" are typically mixed or co-mingled with the polymer such that they tend to remain therewith when it is transferred between vessels or between solvent or dispersion media. A polymer composition can also include materials added after synthesis of the polymer to provide or modify specific properties of such composition. Such materials include, but are not limited to solvent(s), antioxidant(s), photoinitiator(s), sensitizers and other materials as will be discussed more fully below.

The term "photodefinable" refers to the characteristic of a material or composition of materials, such as a polymer or polymer composition in accordance with embodiments of the present invention, to be formed into, in and of itself, a patterned layer or a structure. In alternate language, a "photodefinable layer" does not require the use of another material layer formed thereover, for example, a photoresist layer, to form the aforementioned patterned layer or structure. It will be further understood that a polymer composition having such a characteristic is generally employed in a pattern forming scheme to form a patterned film/layer or structure. It will be noted that such a scheme incorporates an "imagewise exposure" of the photodefinable material or layer formed therefrom. Such imagewise exposure being taken to mean an exposure to actinic radiation of selected portions of the layer, where non-selected portions are protected from such exposure to actinic radiation.

As used herein, the term "self-imagable compositions" will be understood to mean a material that is photodefinable and can thus provide patterned layers and/or structures after direct image-wise exposure of a film formed thereof followed by development of such images in the film using an appropriate developer.

It will be understood that, as used herein, the phrase "microelectronic device" is inclusive of a "micro-optoelectronic device" and an "optoelectronic device". Thus, reference to microelectronic devices or a microelectronic device assemblies are inclusive of optoelectronic devices and micro-optoelectronic devices as well as assemblies thereof.

By the term "derived" is meant that the polymeric repeating units are polymerized (formed) from, for example, polycyclic norbornene-type monomers (or the olefinic monomers of formula (II)), in accordance with formulae (I) or maleic anhydride type monomers of formula (III) wherein the resulting polymers are formed by 2,3 enchainment of norbornene-type monomers with maleic anhydride type monomers in an alternating fashion as shown below:

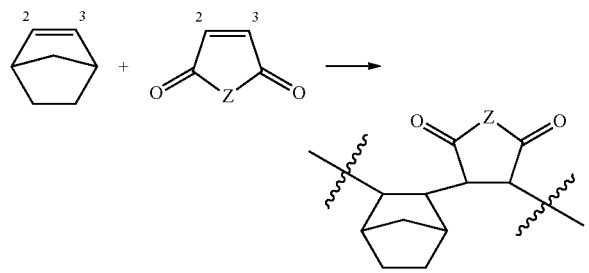

It should be understood that depending upon the monomeric compositions in a given polymer the repeat units may not always be alternating. That is to say, for example, in a copolymer containing other than 50:50 molar ratios of norbornene-type monomers with maleic anhydride monomers, the repeat units are not always alternating but with random blocks of monomers with the higher molar content.

Accordingly, in accordance with the practice of this invention there is provided a composition encompassing:

a) a polymer having one or more first type of repeating units represented by formula (IA), said first type of repeating unit is derived from a monomer of formula (I):

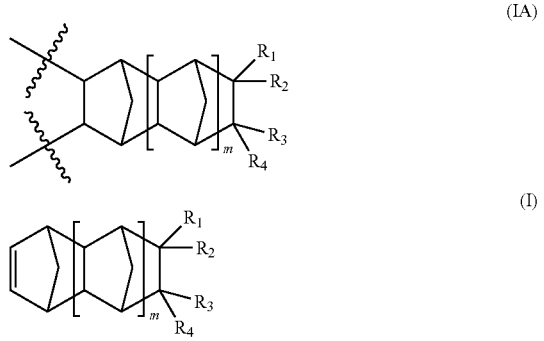

wherein:
m is an integer 0, 1 or 2;
$R_1$, $R_2$, $R_3$ and $R_4$ are the same or different and each independently selected from the group consisting of hydrogen, halogen, linear or branched $(C_1-C_{12})$alkyl, hydroxy$(C_1-C_{12})$alkyl, perfluoro$(C_1-C_{12})$alkyl, $(C_3-C_{12})$cycloalkyl, $(C_6-C_{12})$bicycloalkyl, $(C_7-C_{14})$tricycloalkyl, $(C_6-C_{10})$aryl, $(C_6-C_{10})$aryl$(C_1-C_6)$alkyl, perfluoro$(C_6-C_{10})$aryl, perfluoro$(C_6-C_{10})$aryl$(C_1-C_3)$alkyl, $(C_6-C_{10})$heteroaryl, $(C_5-C_{10})$heteroaryl$(C_1-C_3)$alkyl, hydroxy, $(C_1-C_{12})$alkoxy, $(C_3-C_{12})$cycloalkoxy, $(C_6-C_{12})$bicycloalkoxy, $(C_7-C_{14})$tricycloalkoxy, $(C_6-C_{10})$aryloxy$(C_1-C_3)$alkyl, $(C_5-C_{10})$heteroaryloxy$(C_1-C_3)$alkyl, $(C_6-C_{10})$aryloxy, $(C_5-C_{10})$heteroaryloxy, $(C_1-C_6)$acyloxy, —$(CH_2)_a$—$C(CF_3)_2OR$, —$(CH_2)_a$—$CO_2R$, a group of formula (A):

$$\text{—}(CH_2)_b\text{—}(OCH_2\text{—}CH_2)_c\text{—}OR; \text{ and} \quad (A)$$

a group of formula (B):

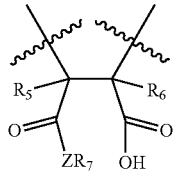

wherein:
a is an integer from 0 to 4;
b is an integer from 0 to 10;
c is an integer 0, 1, 2, 3 or 4; and
R is selected from the group consisting of hydrogen, linear or branched $(C_1-C_6)$alkyl, $(C_5-C_8)$cycloalkyl, $(C_6-C_{10})$aryl and $(C_7-C_{12})$aralkyl;
and
one or more of a second repeating unit represented by formula (IIA) or (IIB), said second repeating unit is derived from a monomer of formula (II):

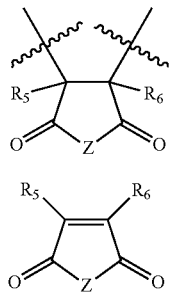

wherein:
Z is O or N—$R_8$ wherein $R_8$ is selected from the group consisting of hydrogen or linear or branched $(C_1-C_9)$alkyl, $(C_3-C_7)$cycloalkyl and $(C_6-C_{12})$aryl;
$R_5$, $R_6$ and $R_7$ are each independently of one another selected from the group consisting of hydrogen, linear or branched $(C_1-C_9)$alkyl, fluorinated or perfluorinated$(C_1-C_9)$ alkyl, $(C_6-C_{12})$aryl and $(C_6-C_{12})$aryl$(C_1-C_{12})$alkyl; and
wherein each of aforementioned groups, where valence is permissible, is optionally substituted with one or more groups selected from the group consisting of linear or branched ($C_1$-$C_6$)alkyl, ($C_3$-$C_7$)cycloalkyl, ($C_1$-$C_6$)perfluoroalkyl, ($C_1$-$C_6$)alkoxy, ($C_3$-$C_7$)cycloalkoxy, ($C_1$-$C_6$)perfluoroalkoxy, halogen, hydroxy, linear or branched hydroxy ($C_1$-$C_6$)alkyl, acetoxy, phenyl, hydroxyphenyl and acetoxyphenyl;
b) a colorant selected from red, green, blue, yellow, magenta, black and cyan colored material;
c) a photoactive compound; and
d) a carrier solvent.

The polymers employed in the photoimagable compositions of this invention can be synthesized by any of the procedures known to one skilled in the art. Generally, such polymers are prepared by free radical polymerization. See for example, U.S. Pat. No. 8,715,900, which discloses ring-opened maleic anhydride polymers with alcohols (ROMA) and copolymerized with a variety of norbornene monomers as described herein, pertinent portions of which are incorporated herein by reference. Also, see U.S. Pat. No. 9,422,376, which further discloses various ring-opened maleic anhydride polymers with amines (ROMI) and copolymerized with a variety of norbornene monomers as described herein, pertinent portions of which are incorporated herein by reference. Various other types of polymers containing norbornene repeat units as employed herein can also be prepared by vinyl addition polymerization using transition metal catalysts, such as for example, nickel or palladium. See for example, U.S. Pat. Nos. 5,929,181; 6,455,650; 6,825,307; and 7,101,654; pertinent portions of which are incorporated herein by reference.

In general, the polymer embodiments in accordance with the present invention encompass the above described one or more of the first distinct type of repeating units of formula (IA) in combination with the repeating unit of formula (IIA) or (IIB), as it will be seen below, various repeating units encompassed by such polymer embodiments are selected to provide properties to such polymer embodiments that are appropriate and desirable for the use for which such embodiments are directed, thus such polymer embodiments are tailorable to a variety of specific applications.

For example, polymer embodiments generally require at least one repeating unit directed to providing imageability. Thus distinct types of repeating units, represented by structural formula (IA) can be used as defined hereinabove, such as, for example $R_1$ being a phenethyl group. However, any of the other functional group which would bring about similar result can also be used instead, for example, a phenyl, benzyl or a substituted phenyl, and the like. Furthermore, the repeat units of formula (IIA), which contains a carboxylic acid pendent group are generally useful for participating in a reaction with appropriately selected additives, or other repeating units that can lead to fix a negative-tone image during exposure to a suitable radiation and further cured by post exposure baking conditions as further explained below. Advantageously, same composition can also be used for fixing a positive-tone image post exposure thermal crosslinking as further explained below. It should further be noted that one of skill in the art readily appreciates that such polymer compositions containing acidic pendent groups can be made post polymerization by utilizing appropriate monomers. For example, a copolymer containing repeat units of formula (IIB) are formed first, which is subsequently reacted with suitable alcohol or amine to form the copolymers containing the carboxylic acid pendent groups by any of the known procedures in the art. Thus certain residual amount of the anhydride monomeric repeat units of formula (IIB) may always be present in the polymer employed herein.

Advantageously, it has further been found that the polymers employed in the compositions of this invention can also contain one or more of distinct second type of repeat units of formula (IIA) along with one or more of distinct repeat units of formula (IA). Accordingly, in some embodiments, the polymers of this invention contain only one repeat units of formula (IA) in combination with repeat units of formula (IIA) and (IIB) derived from only one monomer of formula (II). In some other embodiments, the polymers of this invention contain more than one distinct repeat units of formula (IA) in combination with repeat units of formula (IIA) and (IIB). Accordingly, all such combinations of repeat units are within the scope of this invention.

In general, the polymers employed herein are copolymers containing 50:50 molar ratio of repeat units of formula (IA) with a combination of repeat units of formula (IIA) and (IIB). However, it should be understood that in some embodiments the polymers of this invention may contain 50:50 molar ratio of a combination of more than one distinct repeat units of formula (IA) in combination with repeat units of formula (IIA) and (IIB). That is to say that, generally, the polymer encompasses equal moles of combined distinct repeat units of formula (IA) and combined repeat units of formulae (IIA) and (IIB). In other words, when more than one type of norbornene monomers are used to make the polymer used in the composition embodiment of this invention, then the total moles of the norbornene derived repeat units are same as the total moles of the maleic anhydride derived repeat units (i.e., combined moles of formulae (IIA) and (IIB). Similarly, when more than one type of monomers of formula (II) are used to make the polymer used in the composition embodiment of this invention, then the total moles of the derived repeat units of formula (IIA) and (IIB) are same as the total moles of the norbornene derived repeat units (i.e., combined moles of distinct repeat units of formula (IA)). Thus, generally, the polymers employed herein feature alternating repeat units of norbornene and maleic anhydride units. However, it is also possible that more molar ratios of norbornene type units can be employed to make certain polymers where the excess norbornene repeat units may exist together, such as for example, polymers containing 60:40, 70:30 or 80:20 mole ratio of norbornene to maleic anhydride. Similarly, it is also possible that there may be excess maleic anhydride derived repeat units, such as for example, 40:60, 30:70 or 20:80 mole ratio of norbornene to maleic anhydride. All such combination of polymers can be employed in the composition of this invention.

In general, it has now been found that a polymer containing the monomer repeat unit having an acidic pendent group (generally of formula (IIA), where Z is O, $R_5$ and $R_6$ are hydrogen, and $R_7$ is hydrogen or linear or branched ($C_1$-$C_9$)alkyl or Z is N—$R_8$ and $R_7$ is hydrogen) advantageously provides certain beneficial effect for the photosensitive composition of this invention. Thus, in some embodiments of this invention, the polymer used in the photosensitive composition of this invention contains a monomer repeat unit containing the acid pendent group from about 10 to 50 mol %, and in some other embodiments from 20 to 40 mol %. In some other embodiments the molar percent of the monomer repeat units of formula (IIA), where Z is O and $R_7$ is hydrogen (that means completely ring opened and hydrolyzed), in the polymer may be from about 10 to 50 mol %, from about 20 to 45 mol % and in some other embodiments from about 30 to 40 mol %. In some other embodiments the molar percent of norbornene type monomer repeat units of formula (IA) in the polymer may be from about 50 to 60 mol %.

In another embodiment, the composition of this invention encompasses a polymer derived from a monomer of formula (I) wherein m is 0, $R_1$, $R_2$, $R_3$ and $R_4$ independently represents hydrogen, hexyl, decyl, —$(CH_2)_2$—$C(CF_3)_2OH$, —$(CH_2)_2$—$CO_2H$, benzyl and phenethyl.

In another embodiment the composition of this invention encompasses a polymer wherein Z is O, $R_5$ and $R_6$ are hydrogen, and $R_7$ is hydrogen or linear or branched ($C_1$-$C_9$) alkyl. That is to say that in such embodiments the polymer employed is derived from a maleic anhydride monomer which is ring opened with any of the ($C_1$-$C_9$)alcohols, including methanol, ethanol, n-propanol, isopropanol, n-butanol, iso-butanol, tert-butanol, n-pentanol, n-hexanol, n-heptyl alcohol, n-octyl alcohol, n-nonyl alcohol, and the like. However, it should be noted that any of the higher alcohols, including the cyclic alcohols can also be employed.

In another embodiment the composition of this invention encompasses a polymer wherein Z is N—$R_{12}$, $R_5$ and $R_6$ are hydrogen, $R_7$ is hydrogen and $R_{12}$ is hydrogen or linear or branched ($C_1$-$C_9$)alkyl. That is to say that in such embodiments the polymer employed is derived from a maleic anhydride monomer which is ring opened with any of the ($C_1$-$C_9$)alkyl amines, including methyl amine, ethyl amine, n-propyl amine, isopropyl amine, n-butyl amine, iso-butyl amine, tert-butyl amine, n-pentyl amine, n-hexyl amine, n-heptyl amine, n-octyl amine, n-nonyl amine, and the like.

Accordingly, any of the known monomers of formula (I) can be employed in this aspect of the invention. Representative examples of monomers of formula (I) include the following without any limitations:

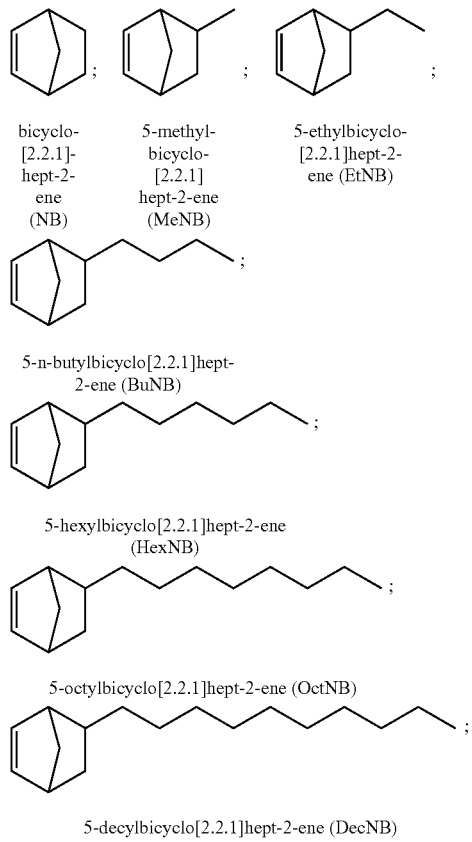

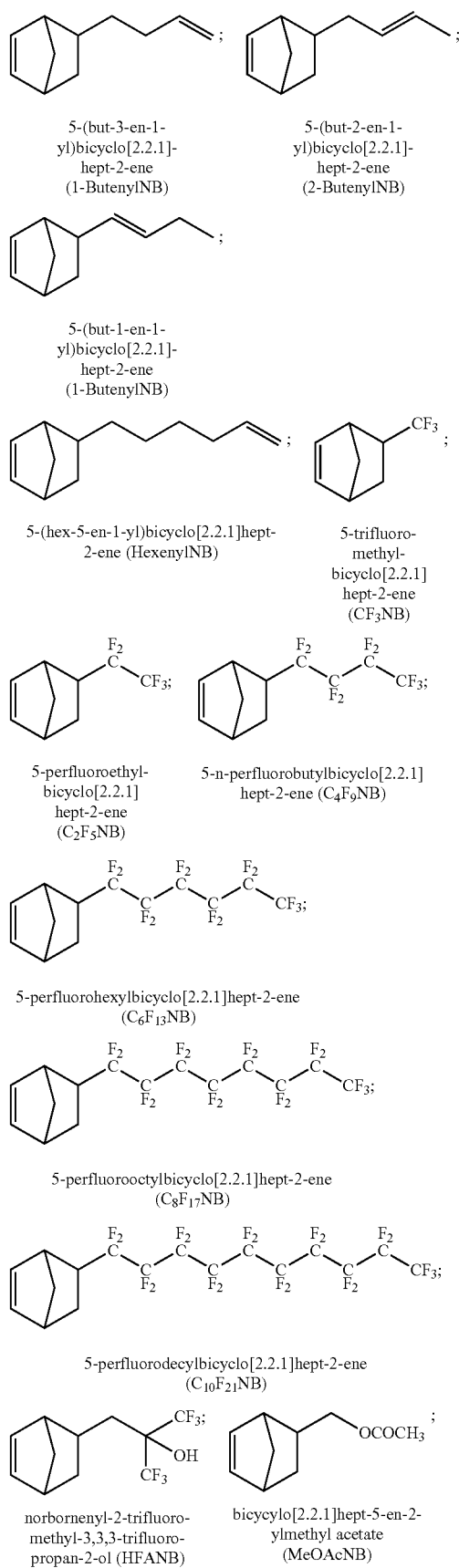

-continued

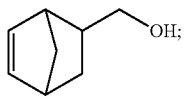

bicycylo[2.2.1]hept-5-en-2-ylmethanol (MeOHNB)

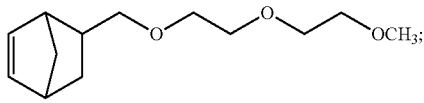

5-((-2-(2-methoxyethoxy)ethoxy)methyl)bicyclo[2.2.1]hept-2-ene (NBTON)

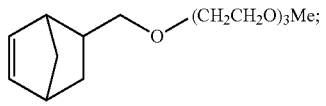

1-(bicyclo[2.2.1]hept-5-en-2-yl)-2,5,8,11-tetraoxadodecane (NBTODD)

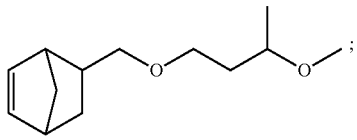

5-(3-methoxybutoxy)methyl-2-norbornene (NB-3-MBM)

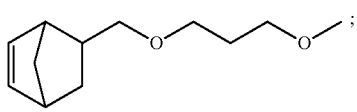

5-(3-methoxypropanoxy)methyl-2-norbornene (NB-3-MPM)

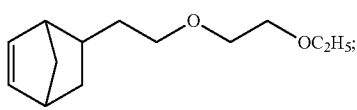

5-(2-(2-ethoxyethoxy)ethyl)bicyclo[2.2.1]hept-2-ene

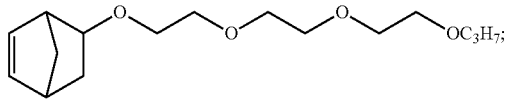

5-(2-(2-(2-propoxyethoxy)ethoxy)ethoxy)bicyclo[2.2.1]hept-2-ene

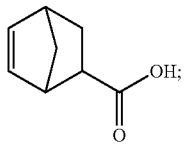

bicyclo[2.2.1]hept-5-ene-2-carboxylic acid (Acid NB)

3-(bicyclo[2.2.1]hept-5-en-2-yl)propanoic acid (NBEtCOOH)

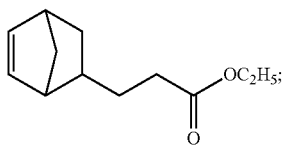

ethyl 3-(bicyclo[2.2.1]hept-5-en-2-yl)propanoate (EPEsNB)

-continued

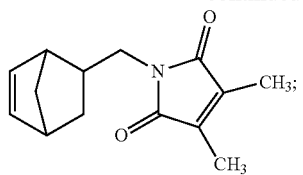

1-(bicyclo[2.2.1]hept-5-en-2-ylmethyl)-3,4-dimethyl-1H-pyrrole-2,5-dione (MeDMMINB)

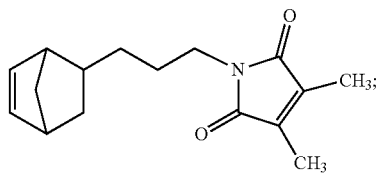

1-(3-(bicyclo[2.2.1]hept-5-en-2-yl)propyl-3,4-dimethyl-1H-pyrrole-2,5-dione (PrDMMINB)

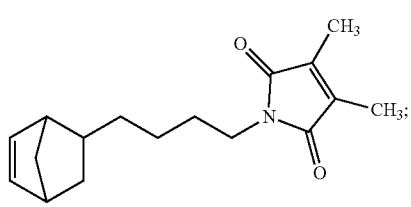

1-(4-(bicyclo[2.2.1]hept-5-en-2-yl)butyl)-3,4-dimethyl-1H-pyrrole-2,5-dione (BuDMMINB)

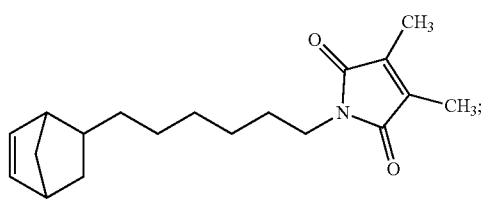

1-(6-(bicyclo[2.2.1]hept-5-en-2-yl)hexyl)-3,4-dimethyl-1H-pyrrole-2,5-dione (HexDMMINB)

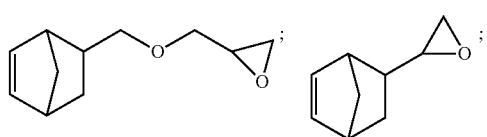 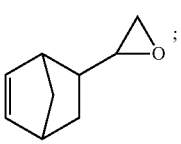

2-((bicyclo[2.2.1]hept-5-en-2-ylmethoxy)methyl)oxirane (MGENB)

2-(bicyclo[2.2.1]hept-5-en-2-yl)oxirane

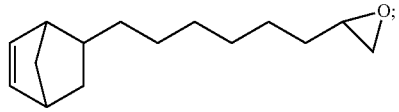

2-(6-(bicyclo[2.2.1]hept-5-en-2-yl)hexyl)oxirane (EONB)

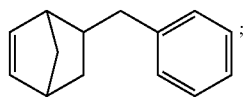

5-benzylbicyclo[2.2.1]hept-2-ene (BenNB)

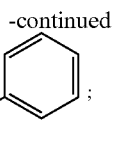

5-phenethylbicyclo[2.2.1]hept-2-ene
(PENB)

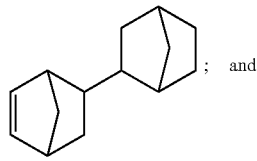

2-(bicyclo[2.2.1]hept-5-
en-2-yl)bi-
cyclo[2.2.1]heptane
(also referred to
herein as NBNBA);

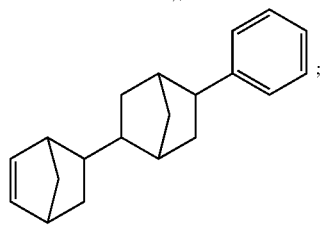

2-(bicyclo[2.2.1]hept-5-en-2-yl)-5-
phenyl-bicyclo[2.2.1]heptane
(also referred to herein as
NBNBAPh)

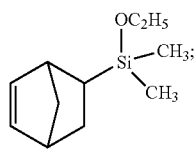 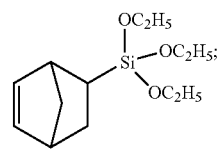

bicyclo[2.2.1]hept-5-
en-2-yl(ethoxy)di-
methylsilane
(NBSiMe₂(OEt)

bicyclo[2.2.1]hept-5-
en-2-yl(triethoxy)silane
(TESNB)

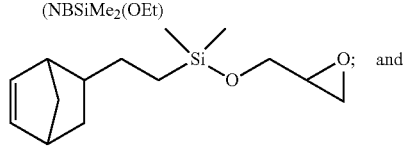

(2-(bicyclo[2.2.1]hept-5-en-2-
yl)ethyl)dimethyl(oxiran-2-
ylmethoxy)silane
(NB—SiMe₂O—MGE)

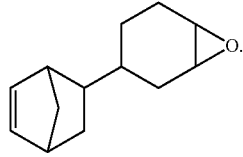

3-(bicyclo[2.2.1]hept-5-en-2-
yl)-7-oxabicyclo[4.1.0]heptane
(NBCHEp)

Turning now to second repeating unit of formula (IIA) or (IIB) to form the polymer for use in the composition of this invention it is contemplated that any maleic anhydride derivative can be used as a monomer, including maleic anhydride itself. Exemplary monomers of such type include but not limited to those selected from the group consisting of:

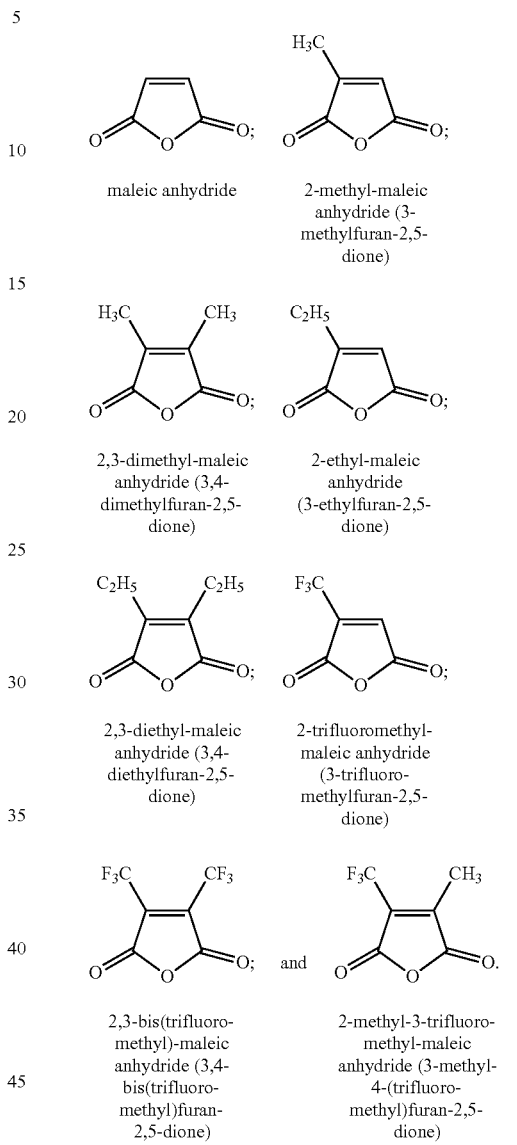

In a further embodiment, the composition of this invention encompasses a polymer which is a copolymer or a terpolymer containing one or more monomers of formula (I) and at least one monomer of formula (II), which results in repeat units of formula (IIA) or (JIB).

In another embodiment, the composition of this invention encompasses a polymer which is a copolymer or a terpolymer containing one or more monomers of formula (II), which results in corresponding repeat units of formulae (IIA) or (JIB) and at least one monomer of formula (I).

In yet a further embodiment, the composition of this invention encompasses a polymer containing one or more monomers of formula (I), and one or more monomers of formula (II), which results in corresponding repeat units of formulae (IIA) or (IIB).

Again, any of the polymerizable monomer as described herein can be used. Thus, in one of the embodiments the polymer of this invention encompasses one or more repeat units derived from the corresponding monomers selected from the group consisting of:
bicyclo[2.2.1]hept-2-ene (NB)
5-hexylbicyclo[2.2.1]hept-2-ene (HexNB);
5-octylbicyclo[2.2.1]hept-2-ene (OctNB);
5-decylbicyclo[2.2.1]hept-2-ene (DecNB);
norbornenyl-2-trifluoromethyl-3,3,3-trifluoropropan-2-ol (HFANB);
5-n-perfluorobutylbicyclo[2.2.1]hept-2-ene ($C_4F_9NB$);
tetraoxadodecanenorbornene (NBTODD);
5-(3-methoxybutoxy)methyl-2-norbornene (NB-3-MBM);
5-(3-methoxypropanoxy)methyl-2-norbornene (NB-3-MPM);
5-((2-(2-methoxyethoxy)ethoxy)methyl)bicyclo[2.2.1]hept-2-ene (NBTON);
2-((bicyclo[2.2.1]hept-5-en-2-ylmethoxy)methyl)oxirane (MGENB);
2-(bicyclo[2.2.1]hept-5-en-2-yl)oxirane; and
2-(7-(bicyclo[2.2.1]hept-5-en-2-yl)hexyl)oxirane.
5-benzylbicyclo[2.2.1]hept-2-ene (BenNB);
5-phenethylbicyclo[2.2.1]hept-2-ene (PENB);
ethyl 3-(bicyclo[2.2.1]hept-2-en-2-yl)propanoate (EPEsNB),
bicyclo[2.2.1]hept-5-ene-2-carboxylic acid (Acid NB) and
norbornenylpropanoic acid (NBEtCOOH).

In yet another embodiment the polymer of this invention encompasses one or more repeat units derived from the corresponding monomers of formula (I) selected from the group consisting of:
bicyclo[2.2.1]hept-2-ene (NB);
5-decylbicyclo[2.2.1]hept-2-ene (DecNB);
norbornenyl-2-trifluoromethyl-3,3,3-trifluoropropan-2-ol (HFANB);
5-phenethylbicyclo[2.2.1]hept-2-ene (PENB); and
norbornenylpropanoic acid (NBEtCOOH).

In a further embodiment of this invention, the composition encompasses a polymer having one or more repeat units derived from the corresponding monomers of formula (II) selected from the group consisting of:
maleic anhydride; and
2-methyl-maleic anhydride.

Non-limiting examples of such copolymers or terpolymers include:
a copolymer containing repeating units derived from 5-phenethylbicyclo[2.2.1]hept-2-ene (PENB) and fully ring opened maleic anhydride repeat unit of formula (IIA), which is ring opened with methanol, i.e., where $R_5$ and $R_6$ are hydrogen, Z is O and $R_7$ is methyl;
a copolymer containing repeating units derived from bicyclo[2.2.1]hept-2-ene (NB) and fully ring opened maleic anhydride repeat unit of formula (IIA), which is ring opened with n-butanol, i.e., where $R_5$ and $R_6$ are hydrogen, Z is O and $R_7$ is n-butyl;
a terpolymer containing repeating units derived from 5-phenethylbicyclo[2.2.1]hept-2-ene (PENB), 5-decylbicyclo[2.2.1]hept-2-ene (DecNB) and fully ring opened maleic anhydride repeat unit of formula (IIA), which is ring opened with methanol, i.e., where $R_5$ and $R_6$ are hydrogen, Z is O and $R_7$ is methyl; and
a copolymer containing repeating units derived from 5-phenethylbicyclo[2.2.1]hept-2-ene (PENB) and fully ring opened maleic anhydride repeat unit of formula (IIA), which is ring opened with n-butylamine, i.e., where $R_5$ and $R_6$ are hydrogen, Z is N-n-butyl and $R_7$ is hydrogen.

The polymers employed to form the compositions of this invention generally exhibit a weight average molecular weight ($M_w$) of at least about 2,000. In general, the polymers as described herein made in accordance with the free radical polymerization exhibit lower molecular weight when compared with the polymers made in accordance with the vinyl addition polymerization methods. Accordingly, in another embodiment, the polymer employed in the composition of this invention has a $M_w$ of at least about 5,000. In yet another embodiment, the polymer employed in the composition of this invention has a $M_w$ of at least about 8,000. In some other embodiments, the polymer of this invention has a $M_w$ of at least about 10,000. In some other embodiments, the polymer of this invention has a $M_w$ ranging from about 20,000 to 50,000. In some other embodiments, especially where the polymer is made by the procedures of vinyl addition polymerization techniques, the polymer of this invention has a $M_w$ of at least about 10,000. In some other embodiments, such vinyl addition polymers employed in this invention has a $M_w$ ranging from about 50,000 to 500,000. The weight average molecular weight ($M_w$) of the polymer can be determined by any of the known techniques, such as for example, by gel permeation chromatography (GPC) equipped with suitable detector and calibration standards, such as differential refractive index detector calibrated with narrow-distribution polystyrene standards.

Advantageously, the colorants used in the composition embodiments in accordance with the present invention makes it possible to form a microlens such that various color filters can be fabricated from the compositions of this invention. Accordingly, the composition of this invention contains at least one or more colorants. Any desired or effective colorant can be employed in the composition of this invention, including dyes, pigments, mixtures thereof, and the like. Any dye or pigment can be chosen, provided that it is capable of being dispersed or dissolved in the composition of this invention and is compatible with various other components as employed herein. The composition of this invention can employ any of the conventional colorant materials, such as color index (C.I.) solvent dyes, disperse dyes, modified acid and direct dyes, basic dyes, sulfur dyes, vat dyes, and the like, which are known to one skilled in the art. Examples of suitable dyes include Neozapon Red 492 (BASF); Orasol Red G (BASF); Direct Brilliant Pink B (Oriental Giant Dyes); Direct Red 3BL (Classic Dyestuffs); Supranol Brilliant Red 3BW (Bayer AG); Lemon Yellow 6G (United Chemie); Light Fast Yellow 3G (Shaanxi); Aizen Spilon Yellow C-GNH (Hodogaya Chemical); Bernachrome Yellow GD Sub (Classic Dyestuffs); Cartasol Brilliant Yellow 4GF (Clariant); Cibanon Yellow 2GN (BASF); Orasol Black CN (BASF); Savinyl Black RLSN (Clariant); Pyrazol Black BG (Clariant); Morfast Black 101 (Rohm & Haas); Diazol Black RN (ICI); Orasol Blue GN (BASF); Savinyl Blue GLS (Clariant); Luxol Fast Blue MBSN (Pylam Products); Sevron Blue 5GMF (Classic Dyestuffs); Basacid Blue 750 (BASF), Neozapon Black X51 (BASF), Classic Solvent Black 7 (Classic Dyestuffs), Sudan Blue 670 (C.I. 61554) (BASF), Sudan Yellow 146 (C.I. 12700) is (BASF), Sudan Red 462 (C.I. 26050) (BASF), C.I. Disperse Yellow 238, Neptune Red Base NB543 (BASF, C.I. Solvent Red 49), Neopen Blue FF-4012 from BASF, Lampronol Black BR from ICI (C.I. Solvent Black 35), Morton Morplas Magenta 36 (C.I. Solvent Red 172), metal phthalocyanine colorants such as those disclosed in U.S. Pat. No. 6,221,137, pertinent portions of which are incorporated herein by reference, and the like. Other suitable dyes include those disclosed in U.S. Patent Application Publication No. 2010/0086683 and U.S. Pat. Nos. 7,732,581; 7,381,831; 6,713,614; 6,646,111; 6,590,082; 6,472,523; 6,713,614; 6,958,406; 6,998,493;

7,211,131; and 7,294,730, pertinent portions of which are incorporated herein by reference. Polymeric dyes can also be used, such as those disclosed in, for example, U.S. Pat. Nos. 5,621,022 and 5,231,135, pertinent disclosures of each of which are incorporated herein by reference, and commercially available from, for example, Milliken & Company as Milliken Ink Yellow 869, Milliken Ink Blue 92, Milliken Ink Red 357, Milliken Ink Yellow 1800, Milliken Ink Black 8915-67, uncut Reactant Orange X-38, uncut Reactant Blue X-17, Solvent Yellow 162, Acid Red 52, Solvent Blue 44, and uncut Reactant Violet X-80.

In some embodiments, solvent dyes are employed. Examples of suitable solvent dyes include Neozapon Red 492 (BASF); Orasol Red G (BASF); Direct Brilliant Pink B (Global Colors); Aizen Spilon Red C-BH (Hodogaya Chemical); Kayanol Red 3BL (Nippon Kayaku); Spirit Fast Yellow 3G; Aizen Spilon Yellow C-GNH (Hodogaya Chemical); Cartasol Brilliant Yellow 4GF (Clariant); Pergasol Yellow CGP (BASF); Orasol Black RLP (BASF); Savinyl Black RLS (Clariant); Morfast Black Conc. A (Rohm and Haas); Orasol Blue GN (BASF); Savinyl Blue GLS (Sandoz); Luxol Fast Blue MBSN (Pylam); Sevron Blue 5GMF (Classic Dyestuffs); Basacid Blue 750 (BASF), Neozapon Black X51 [C.I. Solvent Black, C.I. 12195] (BASF), Sudan Blue 670 [C.I. 61554] (BASF), Sudan Yellow 146 [C.I. 12700] (BASF), Sudan Red 462 [C.I. 260501] (BASF), and the like.

Pigments are also suitable colorants for the compositions as described herein. The pigments can be either organic or inorganic, which are compatible with the compositions of this invention. The pigments used herein are generally present in finely dispersed form. Typically, the organic pigments that are suitable to be employed in this invention have an average primary particle size of 500 nm or less. In some embodiments average primary particle size of the pigment is 200 nm or less; in some other embodiments it is 100 nm or less and in some other embodiments it is 50 nm or less. The inorganic pigments typically have an average particle size of from 0.1 to 5 µm. In some embodiments average particle size of the inorganic pigment is from 0.1 to 3 µm and in some other embodiments it is from 0.1 to 1 µm. The average particle size of these pigments may be determined according to any of the known procedures in the art.

The organic pigment may be a perylene pigment, phthalocyanine pigment, diketopyrrolopyrrole pigment, indigo pigment, thioindigo pigment, anthrachinone pigment, indanthrone pigment, azo pigment including a monoazo, bisazo and azomethine pigment, bisazo condensation pigment, isoindoline pigment, isoindolinone pigment, quinacridone pigment, benzimidazolone pigment, pyrazolochinazolone pigment, perinone pigment and dioxazine pigment.

Non-limiting examples of suitable pigments include HELIOGEN® Green L8730 (BASF), HELIOGEN® Green L8735 (BASF); HELIOGEN® Green L9361 (BASF), HELIOGEN® Blue D6840, D7080, K6902, K6910, L7020, L6700F L6900, L6905F, L6960HD, (BASF), PALIOGEN® Blue L6480, PALIOGEN® Blue 6470, L6360 (BASF), SUNFAST Blue 15:4 and 15:3 (Sun Chemical); HOSTAPERM Blue B2G-D (Clariant), HOSTAPERM® Blue B4G (Clariant), Sudan Blue OS (BASF), NEOPEN Blue FF4012 (BASF), PV Fast Blue B2GO1 (Clariant), IRGALITE Blue BCA (BASF); IRGAZIN® Red L3660 HD, IRGAZIN® Red L3670 HD, PALIOGEN Red 3340, 3871K, L3885, L3920 (BASF), LITHOL Scarlet D3700 (BASF), LITHOL Scarlet 4440 (BASF), Permanent Red P-F7RK, Bon Red C (Dominion Color Company), PALIOGEN Black L0086, PALIOGEN® Black EH 0788, LUMOGEN® Black FK 4281, PALIOGEN Black L0084 (BASF); Pigment Black K801 (BASF); and carbon blacks such as REGAL 330™ (Cabot), Nipex 150 (Degussa) Carbon Black 5250 and Carbon Black 5750 (Columbia Chemical), and the like. Other suitable pigments include those disclosed in U.S. Pat. Nos. 7,905,954; 7,503,973; 7,465,348; and 7,427,323, pertinent disclosures of each of which are incorporated herein by reference.

Any of the inorganic pigment which is suitable in the composition of this invention can be used. Exemplary inorganic pigments include without any limitation Pigment Blue 28, 36, Pigment Green 17, 26, 50, or Pigment Black 12, 30, and the like.

Mixtures of two or more dyes, two or more pigments, and one or more dyes with one or more pigments can also be used.

Accordingly, any of the known colorants as described herein can be employed in the compositions of this invention which would bring about the above intended change. In general, to the dyes as used herein are soluble in the solvents used to form the compositions of this invention and thus compositions containing the dye are typically clear solutions. Whereas the pigments as used herein are dispersible in the compositions of this invention and therefore compositions containing the pigments are generally in the colloidal form with finely dispersed pigments.

In some embodiments of this invention the composition encompasses a colorant which is a dye. As noted, generally the dye employed is soluble in the polymer solution, thus forming a clear composition.

Non-limiting examples of one or more of the specific colorants that maybe employed in the composition of this invention are selected from the group consisting of:

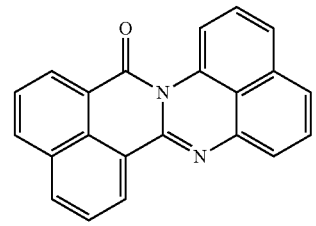 [SMILES: O=c1c2cccc3cccc(c32)c2nc3cccc4cccc(c43)n12]

14H-benzo[4,5]isoquinolino[2,1-a]perimidin-14-one (CAS No. 6829-22-7) complexed with cobalt, which is a perimidinone azo metal complex dye, commonly available as Solvent Red or sold under the tradename of Savinyl Fire Red, cobalt complex, from Clariant;

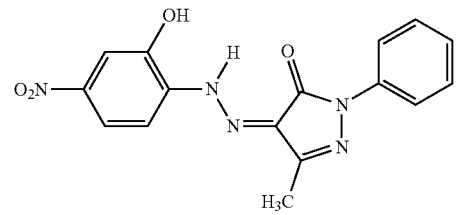 [SMILES: CC1=NN(c2ccccc2)C(=O)/C1=N\Nc1ccc([N+](=O)[O-])cc1O]

(Z)-4-(2-(2-hydroxy-4-nitrophenyl)hydrazineylidene)-5-methyl-2-phenyl-2,4-dihydro-3H-pyrazol-3-one (CAS No. 12227-55-3) complexed with chromium, which is a pyrazoline azo metal complex, commonly available as Solvent Red 122, and sold under the tradename, ORASOL® red from BASF;

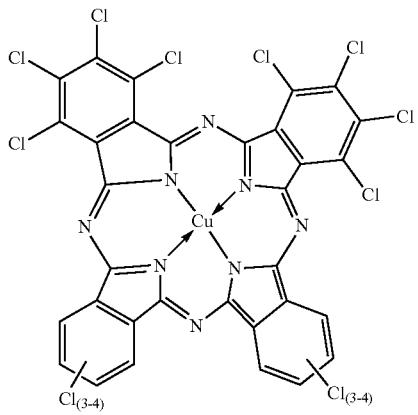

Copper complexed phthalocyanines (CAS no. 1328-53-6), commonly available as pigment green 7 and sold under the tradename of Microlith Green from BASF;

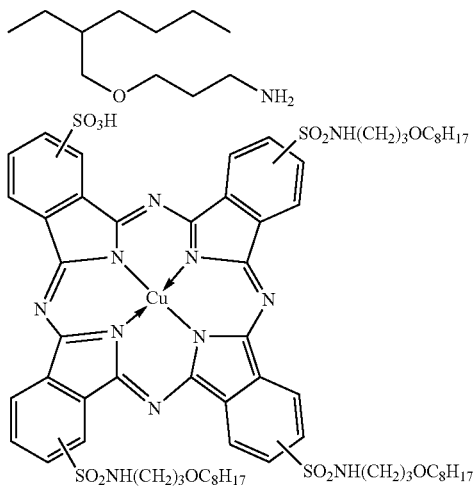

Cuprate(1-), [C,C,C-tris[[[3-[(2-ethylhexyl)oxy]propyl]amino]sulfonyl]-29H,31H-phthalocyanine-C-sulfonato(3-)N29,N30,N31,N32]-, hydrogen, compound with 3-[(2-ethylhexyl)oxy]-1-propanamine (1:1) (CAS No. 94277-77-7), commonly available as a blue coloring agent and sold under the tradename ORASOL® Blue 855 from BASF;

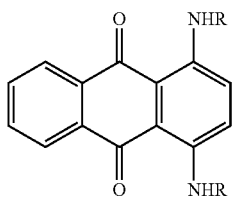

1, 4-bis(alkylamino)anthracenedione, where R is methyl, ethyl, n-propyl, n-butyl, n-pentyl, 2-ethylhexyl, 3-((2-ethylhexyl)oxy)propyl, 3-methoxypropyl, phenyl, p-tolyl, some of such dyes are commonly commercially available under the tradenames of Sudan Blue B from BASF (CAS No. 64553-79-3), Sudan Blue 673 (CAS No. 90170-70-0), and, Sudan Blue ER (CAS No. 74499-36-8);

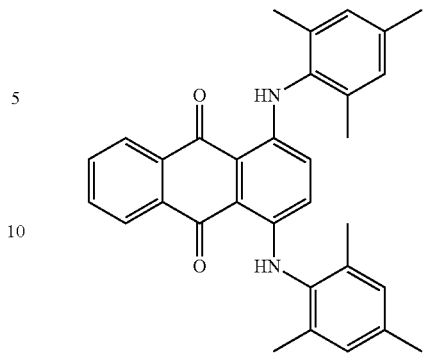

1,4-bis(mesitylamino)anthracene-9,10-dione (CAS No. 116-75-6), commonly available as a blue coloring agent and sold under the tradename Solvent Blue 104 or Polysanthren Blue from Clariant;

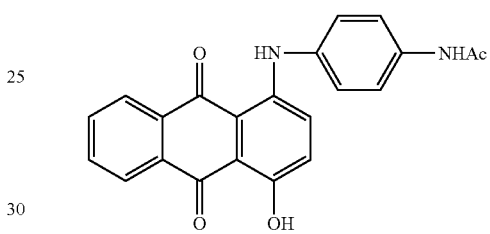

N-(4-((4-hydroxy-9,10-dioxo-9,10-dihydroanthracen-1-yl)amino)phenyl)acetamide (CAS No. 67905-17-3), commonly available as a blue coloring agent and sold under the tradename Solvent Blue 122 or Polysanthren G from Clariant, and Monoazo dye, commonly available as a black coloring agent and sold under the tradename ORASOL® Black X51 (CAS No. 12237-22-8) from BASF.

In some other embodiments the composition of this invention encompasses a colorant, which is a pigment. Again, one or more pigments can be employed in the compositions of this invention in order to bring about the intended change. In some other embodiments the composition of this invention encompasses one or more pigments in combination with one or more dyes.

Any of the solvents that can dissolve all of the components of the composition of this invention can be used as a carrier solvent. Representative examples of such solvents include alcohols, such as ethanol, isopropanol, butanols, and the like. Ketone solvents, such as acetone, methyl ethyl ketone (MEK), methyl amyl ketone (MAK), cyclohexanone, cyclopentanone, and the like. Hydrocarbon solvents, such as decane, toluene, p-menthane, and the like. Ester solvents, such as benzyl acetate, ethyl acetate, and the like. Glycol and ether solvents, such as diethylene glycol dimethyl ether, propylene glycol monomethyl ether (PGME), propylene glycol monomethyl ether acetate (PGMEA), and the like. Various other solvents, such as N-methyl-2-pyrrolidone (NMP), gamma-butyrolactone (GBL), N,N-dimethylacetamide, N,N-dimethylformamide (DMF), anisole, methyl 3-methoxypropionate, tetrahydrofuran (THF), 3-ethoxy-1,1,1,2,3,4,4,5,5,6,6,6-dodecafluoro-2-(trifluoromethyl)hexane (HFE-7500), 1,1,1,2,2,3,3,4,4-nonafluoro-4-methoxybutane, 1,1,1,2,2,3,4,4,4-nonafluoro-3-methoxybutane and mixtures in any combination thereof.

As mentioned above, the polymer compositions of this invention further contains a photoactive compound (PAC). Any of the PACs known to one skilled in the art which would bring about the desired results as further discussed herein can be employed in the composition of this invention. Broadly speaking, the PAC that can be employed in this invention is a photosensitive compound which when exposed to suitable radiation undergoes a chemical transformation such that the resulting product is generally more soluble in a developing solvent, such as for example, alkali solution thus facilitating the exposed regions to dissolve more readily than the unexposed regions. As noted, the composition of this invention further encompass an epoxy resin and a solvent. Further, such compositions are capable of forming films useful as self-imagable layers in the manufacture of various image sensor devices contemplated as described herein. That is to say that when image-wise exposed to actinic radiation, such layers (or films) can be developed to form a patterned film, where such pattern is reflective of the image through which the film was exposed, and then can be formed into microlens for example, as described further below in specific examples.

In this manner, structures can be provided that are, or are to become, a part of such image sensor devices. For example, such films may be useful for forming microlens and/or can be used as color filters as is well known in the art. It will be noted that such examples are only a few of the many uses for such a self-imagable film, and such examples do not serve to limit the scope of such films or the polymers and polymer compositions that are used to form them.

Generally, the PACs that are suitable in this invention contain a diazo-quinone group of formula (C):

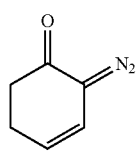
(C)

Non-limiting examples of such a photoactive compound (PAC) can include a group, such as, 1,2-naphthoquinonediazide-5-sulfonyl moiety and/or a 1,2-naphthoquinonediazide-4-sulfonyl moiety as represented by structural formulae (IIIa) and (IIIb), respectively:

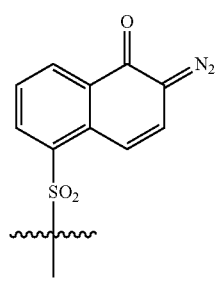
(IIIa)

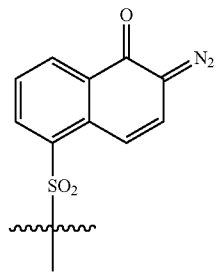
(IIIb)

Other such photoactive moieties, among others, include sulfonyl benzoquinone diazide group represented by structural formula (IIIc):

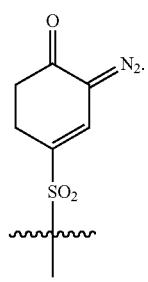
(IIIc)

Generally, the functional groups of formulae (IIIc), (IIIb) and/or (IIIc) are incorporated into the photosensitive composition as an esterification product of the respective sulfonyl chloride (or other reactive moiety) and a phenolic compound, such as one or more of the exemplary compounds represented below collectively as structural formulae (IVa) to (IVai). Thus, any one, or any mixture of two or more of such esterification products are combined with the resin in forming the photosensitive resin compositions of the present invention. In the formulae (IVa) to (IVai) below, Q may represent any of the structures (IIIa), (IIIb) or (IIIc). Advantageously, when a portion of a film or a layer of the photosensitive composition is exposed to appropriate electromagnetic radiation, these esterification products generate a carboxylic acid which enhances the solubility of such exposed portion in an aqueous alkali solution as compared to any unexposed portions of such film. Generally, such photosensitive materials are incorporated into the composition in an amount from 1 to 50 parts by weight material to 100 parts by weight resin. Where the specific ratio of the photosensitive material to resin is a function of the dissolution rate of exposed portions as compared to unexposed portions and the amount of radiation required to achieve a desired dissolution rate differential.

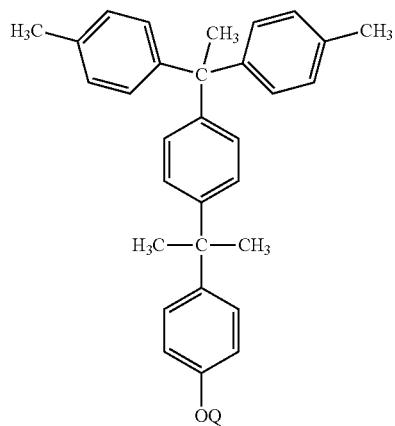 (IVa)
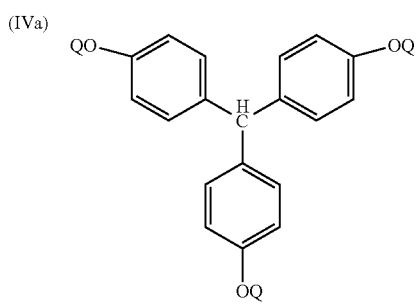 (IVb)
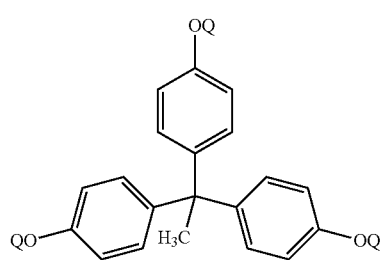 (IVc)
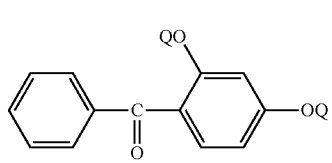 (IVd)
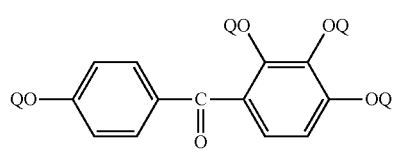 (IVe)
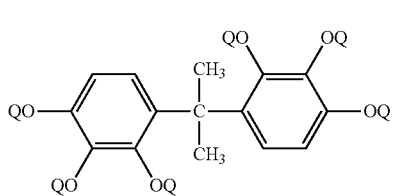 (IVf)
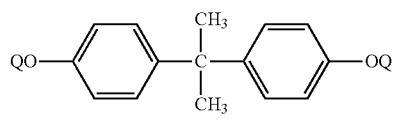 (IVg)
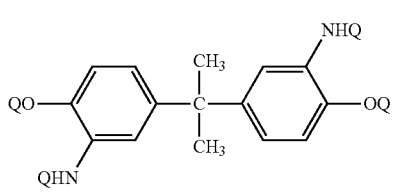 (IVh)
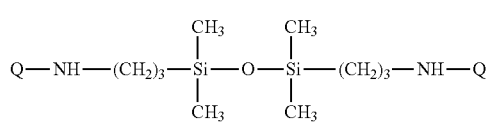 (IVi)
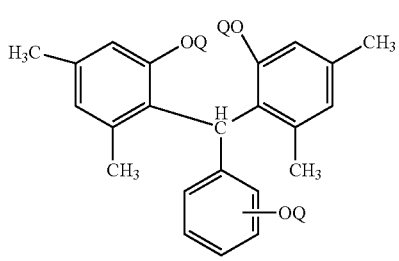 (IVj)
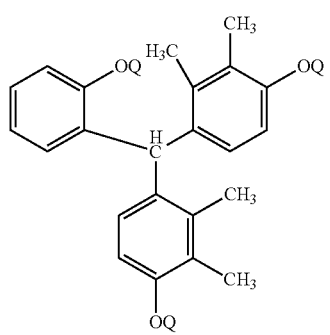 (IVk)
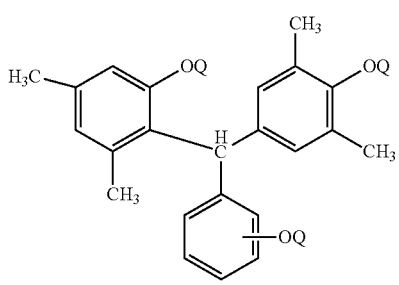 (IVl)

-continued
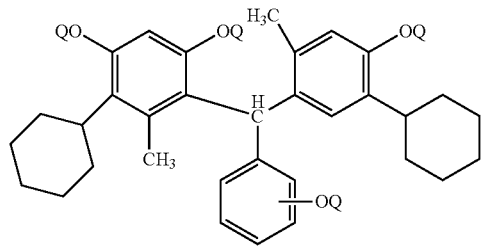
(IVm)
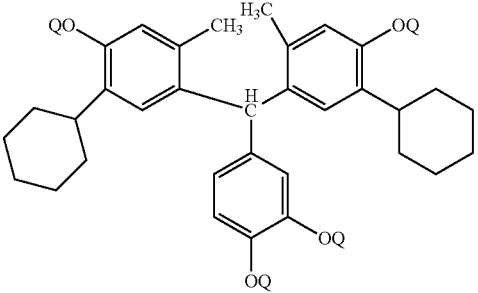
(IVn)
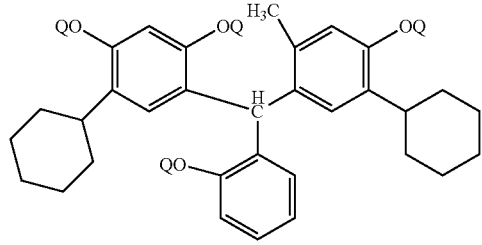
(IVo)
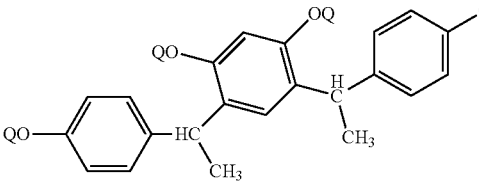
(IVp)
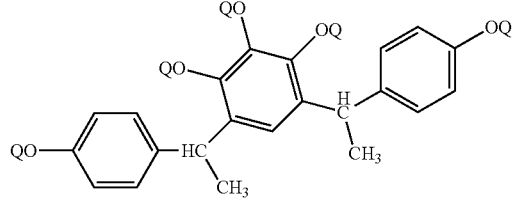
(IVq)
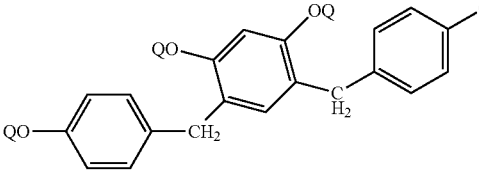
(IVr)
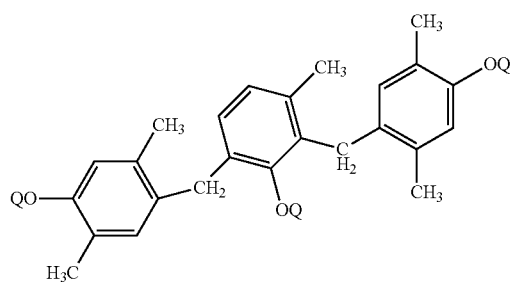
(IVs)
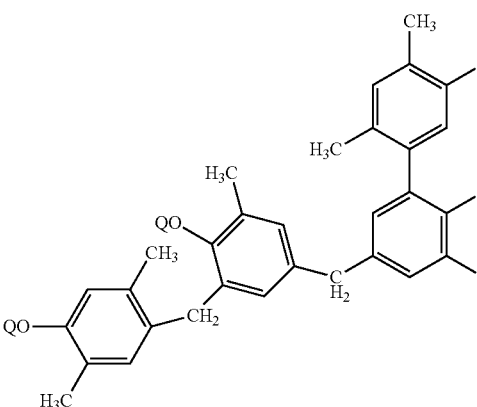
(IVt)
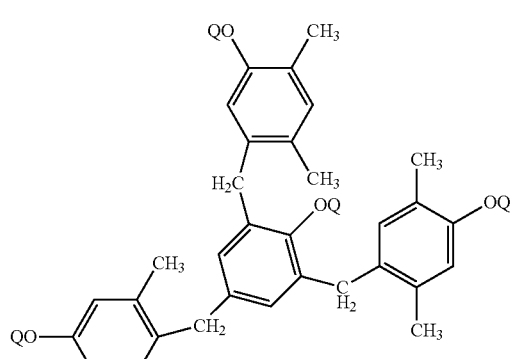
(IVu)
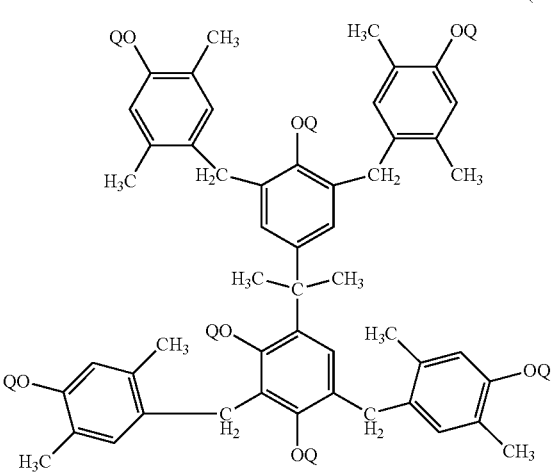
(IVv)

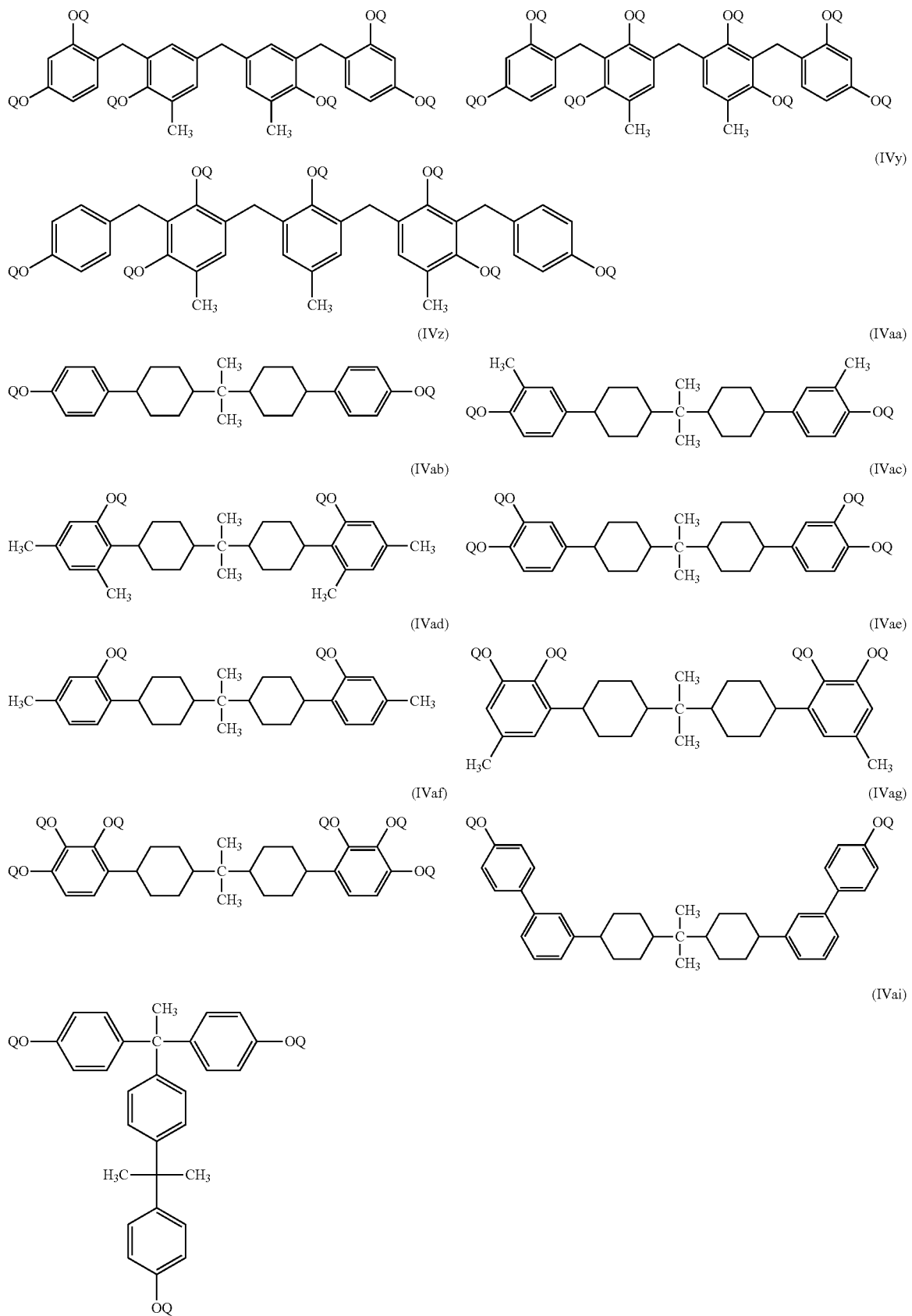

In the above listed PACs of formulae (IVa) to (IVai), Q refers to any one of photoactive moieties of formulae (IIIc), (IIIb) or (IIIc) or hydrogen, but at least one of these Q in each of these structures is (IIIa), (IIIb) or (IIIc). Several of the PACs listed above are commercially available. For example, PAC-5570 of formula (IVc) (St. Jean Photochemicals Inc., Quebec, Canada), SCL6 of formula (IVd) (Secant Chemicals Inc., Winchendon, Mass., USA), TrisP3M6C-2-201 of formula (IVo) (also referred to herein as TrisP), collectively TS-200, TS-250 and TS-300 of formula (IVa), and 4NT-300 of formula (IVe) (all from Toyo Gosei Co. Ltd., Chiba, Japan). It should be noted that for PACs of the types TS-200, TS-250 and TS-300, the degree of substitution of Qs also varies based on the product used. For instance, TS-200 is substituted with 67% of Q, TS-250 is substituted with 83% of Q, and TS-300 with 100% of Q, the unsubstituted portion being hydrogen. Again, Q in each of these instances refers to one of group (IIIa), (IIIb) or (IIIc).

In some embodiments the composition of this invention encompasses a PAC of the formula:

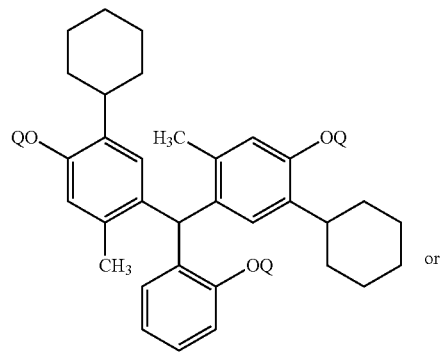

(IVo)

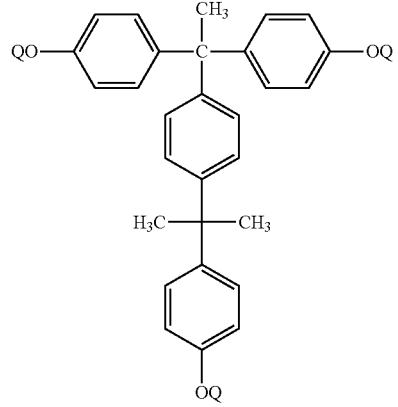

(IVai)

or wherein at least one of Q is a group of formula (IIIc) or (IIIb) and the remaining Q is hydrogen.

The amount of PACs incorporated into the compositions depends upon the type of polymer used and to the dosage level of the exposure contemplated. The amount can vary generally from about 5 to 50 parts per 100 parts by weight of the polymer and typically from about 10 to about 30 parts by weight, although other advantageous amounts of such materials are also appropriate and within the scope of the present invention.

Advantageously, it has now been found that the compositions of this invention contain at least one or more of the crosslinking agents. Any of the crosslinking agents known in the literature that would bring about the crosslinking of the polymer with other additives during the curing stage can be employed in the embodiments of the present invention.

Such exemplary epoxies and other cross-linking additives, include but are not limited to, bisphenol A epoxy resin (LX-1—Daiso Chemical Co., Osaka, Japan), 2,2'-((((1-(4-(2-(4-(oxiran-2-ylmethoxy)phenyl)propan-2-yl)phenyl)ethane-1,1-diyl)bis(4,1-phenylene))bis(oxy))bis(methylene)) bis(oxirane) (Techmore VG3101L—Mitsui Chemical Inc.), trimethylolpropane triglycidylether (TMPTGE—CVC Specialty Chemicals, Inc.), and 1,1,3,3,5,5-hexamethyl-1,5-bis (3-(oxiran-2-ylmethoxy)propyl)trisiloxane (DMS-E09—Gelest, Inc.), liquid epoxy resins (D.E.R.™ 732, where n=8 to 10, and D.E.R.™ 736, where n=4 to 6—both from Dow Chemical Company), bis(4-(oxiran-2-ylmethoxy)phenyl) methane (EPON™ 862, Hexion Specialty Chemicals, Inc.), triglycidyl ether of poly(oxypropylene)epoxide ether of glycerol (commercially available as Heloxy 84 or GE-36 from Momentive Specialty Chemicals Inc.) or BOC Science, 2-((4-(tert-butyl)phenoxy)methyl)oxirane (commercially available as Heloxy 65 from Momentive Specialty Chemicals Inc.) and silicone modified epoxy compound (commercially available as BY16-115 from Toray-Dow Corning Silicone Co., Ltd.) as shown below:

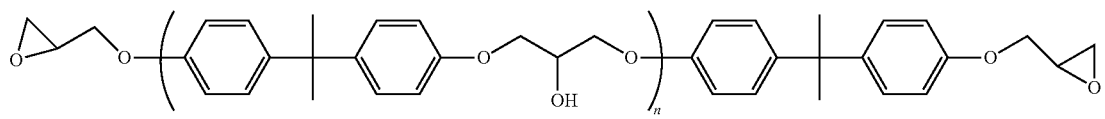

LX-01, where n is from 1 to 5

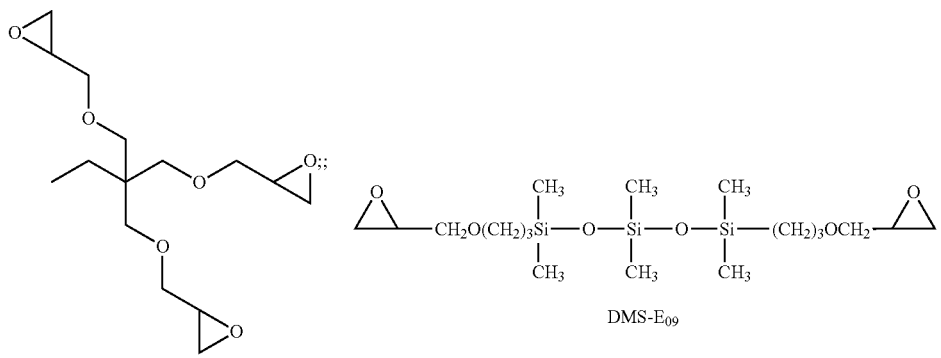

2,2'-(((2-ethyl-2-((oxiran-2-ylmethoxy)-methyl)propane-1,3-diyl)bis(oxy))bis-(methylene))bis(oxirane) (TMPTGE), commercially available as Denacol EX-321L (Nagase)

DMS-E$_{09}$

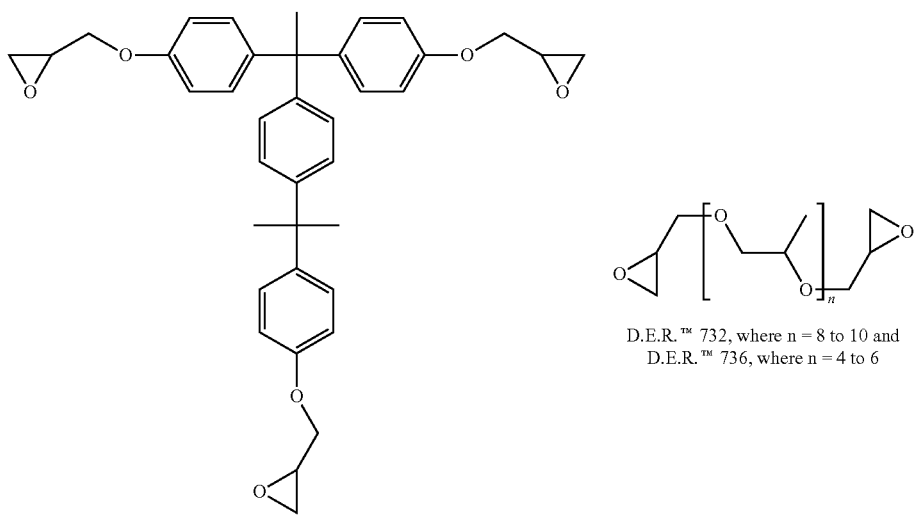

Techmore VG3101L

D.E.R.™ 732, where n = 8 to 10 and
D.E.R.™ 736, where n = 4 to 6

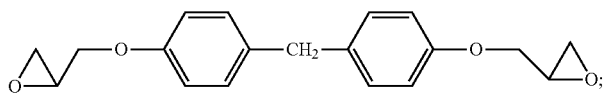

EPON™ 862, commercially available from Momentive Specialty Chemicals Inc.

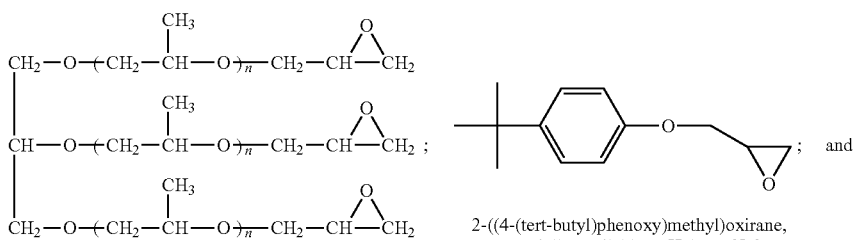

triglycidyl ether of poly(oxypropylene)epoxide ether of glycerol, where n is from 6 to 10, commercially available as Heloxy 84 or GE-36 from Momentive Specialty Chemicals Inc.

2-((4-(tert-butyl)phenoxy)methyl)oxirane, commercially available as Heloxy 65 from Momentive Specialty Chemicals Inc.

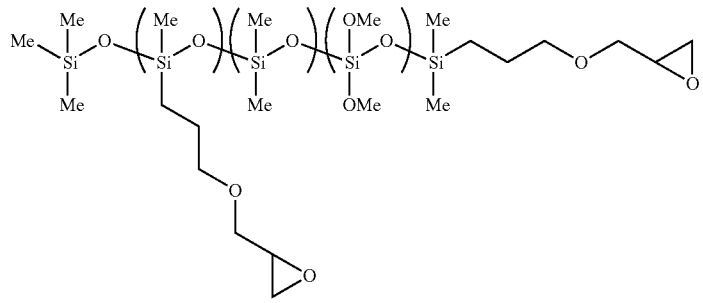

Silicone modified epoxy compound commercially available as BY16-115 from Toray-Dow Corning Silicone Co., Ltd.

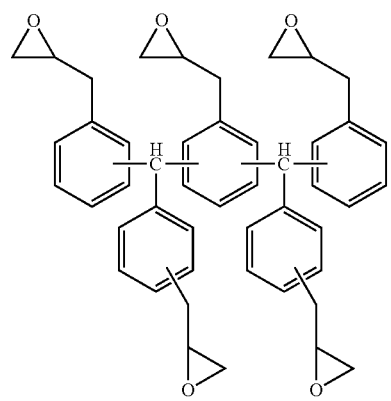

JER1032H60, available from Nippon Kayaku Co., Ltd.

Other cross-linking agents that can be used in the compositions of this invention include the following:

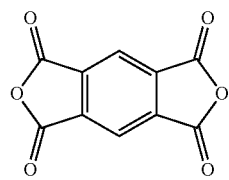

1H,3H-benzo[1,2-c:4,5-c′]difuran-1,3,5,7-tetraone (PMDA), available from Aldrich

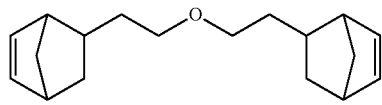

5,5′-(oxybis(ethane-2,1-diyl))bis(bicyclo[2.2.1]hept-2-ene) (NBEtOEtNB)

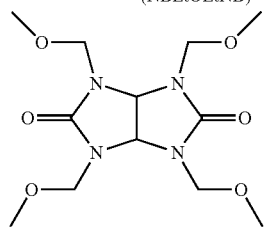

Powderlink 1174, available from Cytec, 1,3,4,6-tetrakis(methoxymethyl)tetra-hydroimidazo[4,5-d]imidazole-2,5(1H,3H)-dione

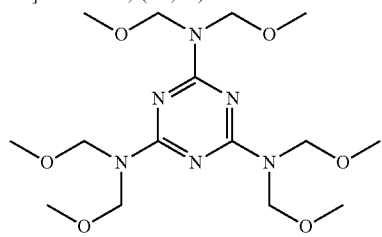

N2,N2,N4,N4,N6,N6-hexakis(methoxymethyl)-1,3,5-triazine-2,4,6-triamine, Cymel 1170, available from Cytec

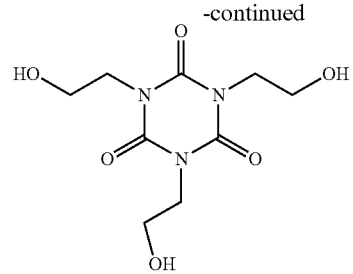

1,3,5-tris(2-hydroxyethyl)-1,3,5-triazinane-2,4,6-trione, THETATO, available from Aldrich

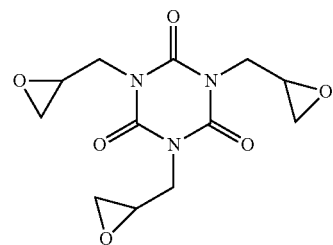

1,3,5-tris(oxiran-2-ylmethyl)-1,3,5-triazinane-2,4,6-trione, TOTATO, available from Aldrich

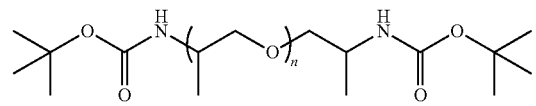

N—BOC JD-2000, where n = 30

Still other exemplary epoxy resins or cross-linking additives include, among others Araldite MTO163 and Araldite CY179 (manufactured by Ciba Geigy); and EHPE-3150, Epolite GT300 and (manufactured by Daicel Chemical). Still other exemplary cross-linking or crosslinkable materials that can be used as additives in the forming of a photosensitive composition of the present invention include, among others, bisphenol A epoxy resin, bisphenol F epoxy resin, silicone containing epoxy resins or the like, propylene glycol diglycidyl ether, polypropylene glycol diglycidyl ether, glycidyloxypropyltrimethoxysilane, polymethyl (glycidyloxypropyl)cyclohexane or the like; polymers containing oxazoline rings such as 2-methyl-2-oxazoline, 2-ethyl-2-oxazoline, 1,3-bis(2-oxazoline-2-yl)benzene, 1,4-bis(2- oxazoline-2-yl)benzene, 2,2'-bis (2-oxazoline), 2,6-bis(4-isopropyl-2-oxazoline-2-yl)pyridine, 2,6-bis(4-phenyl-2-oxazoline-2-yl)pyridine, 2,2'-isopropylidenebis (4-phenyl-2-oxazoline), (S,S)-(−)-2,2'-isopropylidenebis (4-tert-butyl-2-oxazoline), poly(2-propenyl-2-oxazoline) or the like; N-methylolacrylamide, N-methylol methacrylamide, furfuryl alcohol, benzyl alcohol, salicyl alcohol, 1,2-benzene dimethanol, 1,3-benzene dimethanol, 1,4-benzene dimethanol and resole type phenol resin or mixtures thereof.

The amount of epoxy compound may also vary as noted for PACs depending upon the base polymer employed in the composition and the amount can also vary depending upon the intended result. The amount can vary generally from about 1 to 50 parts by weight per 100 parts of the polymer (i.e., parts per hundred parts resin, pphr) and typically from about 2 to about 30 parts by weight, although other advantageous amounts of such materials are also appropriate and within the scope of the present invention. In addition, one or more different types of epoxy compounds as enumerated herein can be used in the composition of this invention and the amounts of each can thus be varied as needed. In another embodiment at least two of the epoxy compounds as enumerated herein are employed.

Advantageously, it has now been found that polymer compositions of this invention provide several desirable properties especially when compared to several of the polymers reported in the literature for similar applications. This aspect is further demonstrated by specific examples that follows. More specifically, the compositions of this invention surprisingly show thermal properties in that the compositions can be tailored to make microlens arrays immediately after patterning and curing stage as further described in detail below.

In addition, various other additives/components can be added to the composition of this invention, which is used for the formation of the photoimagable layer such that its thermal and mechanical properties can be tailored as desired for the intended formation of color filter and/or microlens containing devices. Also, other additives can be used to alter the processability, which include increase the stability of the polymer to thermal and/or light radiation. In this regard, the additives can include, but are not limited to, surfactants, antioxidants, adhesion promoters, and the like. Such additives can be used alone or in any combination thereof. Non-limiting examples of such compounds are selected from the group consisting of the following, commercially available materials are indicated by such commercial names.

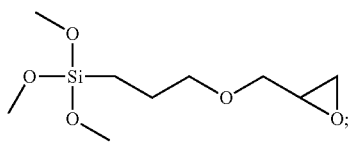

trimethoxy(3-(oxiran-2-ylmethoxy)propyl)silane, also commonly known as 3-glycidoxypropyl trimethoxysilane (3-GTS)

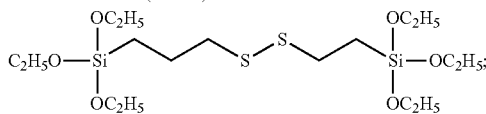

((triethoxysilyl)propyl)disulfide (Si-75 or Si-266 from Evonik)

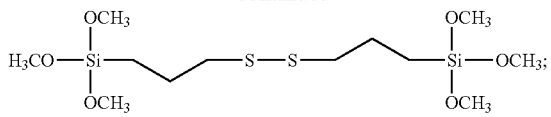

((trimethoxysilyl)propyl)disulfide

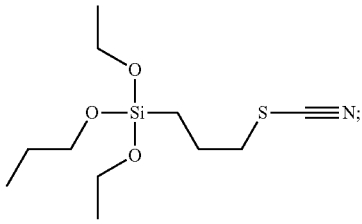

diethoxy(propoxy)(3-thiocyanatopropyl)silane, commercially available as SIT-7908.0 from Gelest

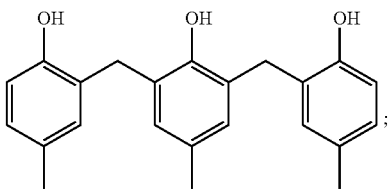

2,2'-((2-hydroxy-5-methyl-1,3-phenylene)bis(methylene))bis(4-methylphenol)- (Antioxidant AO-80 from TCI Japan)

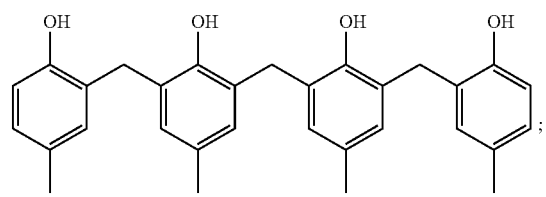

6,6'-methylenebis(2-(2-hydroxy-5-methylbenzyl)-4-methylphenol) (4-PC)

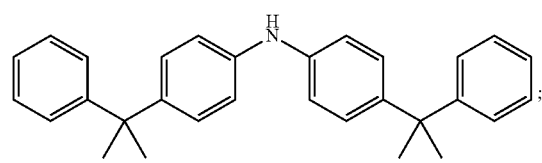

bis(4-(2-phenylpropan-2-yl)phenyl)amine, commercially available as Naugard-445 from Addivant

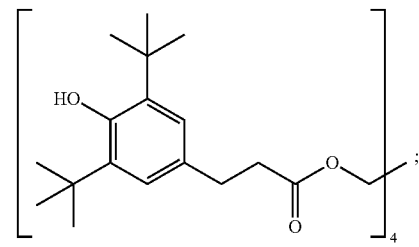

pentaerythritol tetrakis(3-(3,5-di-tert-butyl-4-hydroxyphenyl)propionate) (Irganox 1010 from BASF)

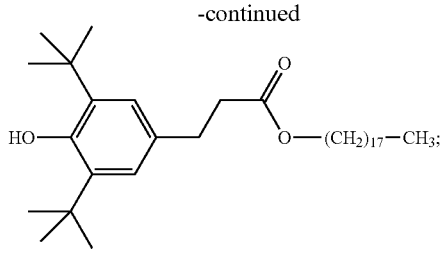

3,5-bis(1,1-dimethylethyl)-4-hydroxy-octadecyl ester
benzenepropanoic acid (Irganox 1076 from BASF)

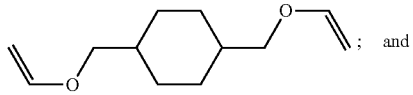

1,4-bis[(ethenyloxy)methyl]-cyclohexane
(Cyclohexane Divinyl ether (CHDVE))

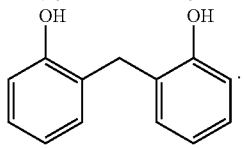

2,2'-methylenediphenol

In yet another aspect of this invention there is further provided an article encompassing an array of microlens with color filter functionality, wherein the arrays are formed from the composition according to this invention. The arrays can be formed in any of the configuration depending upon the intended use. For example, in some embodiments the arrays are in the checkerboard configuration.

In yet another aspect of this invention there is further provided a method of forming a patterned film for the fabrication of a color filter-microlens array in a microelectronic or optoelectronic device comprising:

coating a suitable substrate with a composition according to this invention to form a film;

patterning the film with a mask by exposing to a suitable radiation;

developing the film after exposure to form a photopattern; and heating the patterned film to a suitable temperature to form an array of microlens.

The coating of the desired substrate to form a film with photosensitive composition of this invention can be performed by any of the coating procedures as described herein and/or known to one skilled in the art, such as by spin coating. Other suitable coating methods include without any limitation spraying, doctor blading, meniscus coating, ink jet coating and slot coating. Suitable substrate includes any appropriate substrate as is, or may be used for electrical, electronic or optoelectronic devices, for example, a semiconductor substrate, a ceramic substrate, a glass substrate.

Next, the coated substrate is first softbaked, i.e., heated to facilitate the removal of residual casting solvent, for example to a temperature from 60° C. to 140° C. for from about 1 to 30 minutes, although other appropriate temperatures and times can be used. In some embodiments the substrate is first softbaked at a temperature of from about 100° C. to about 130° C. for 2 minutes to 10 minutes. After the heating, the film is generally imagewise exposed to an appropriate wavelength of actinic radiation, wavelength is generally selected based on the choice of the photobase generator employed in combination with the photosensitizer, if any, in the polymer composition as described hereinabove. However, generally such appropriate wavelength is that produced by a mercury vapor lamp which is from 200 to 450 nm depending upon the type of mercury vapor lamp employed. It will be understood that the phrase "imagewise exposure" means exposing through a masking element to provide for a resulting pattern of exposed and unexposed portion of the film.

After an imagewise exposure of the film formed from the composition in accordance with the present invention, a development process is employed. Advantageously, the compositions of this invention function as a "positive tone" composition. As is well known in the art, in the "positive tone" composition, for example, the development process removes only exposed portions of the film thus leaving a positive image of the masking layer in the film. That is, the film upon exposure to suitable actinic radiation becomes more soluble in a developing solvent.

Generally, suitable developers for positive tone compositions can include aqueous solutions of inorganic alkalis such as sodium hydroxide, potassium hydroxide, sodium carbonate, ammonia, and aqueous solutions of organic alkalis such as 0.26N tetramethylammonium hydroxide (TMAH), ethylamine, triethylamine and triethanolamine. Where an organic alkali is used, generally an organic solvent essentially fully miscible with water is used to provide adequate solubility for the organic alkali. Aqueous solutions of TMAH are well known developer solutions in the semiconductor industry. Suitable developers can also include organic solvents such as propylene glycol methyl ether acetate (PGMEA), 2-heptanone, cyclohexanone, toluene, xylene, ethyl benzene, mesitylene and butyl acetate, among others.

Thus some embodiments of the present invention provide self-imagable films that after imagewise exposure, a resulting image is developed using an aqueous base solution. After the image is developed, the substrate is rinsed to remove excess developer solvent, typical rinse agents are water or appropriate alcohols and mixtures thereof.

After the aforementioned rinsing, the substrate is dried and the imaged film finally cured. That is to say, the image is fixed. In this step, the composition undergoes cross-linking reaction where the remaining polymer is reacted with the cross-linking agent employed as described herein. The heating is generally carried out at a desirable temperature, for example, from above 160° C. to 250° C. for a sufficient length of time, i.e., from several minutes to one or more hours. Where the remaining layer cross links with the epoxy additive as described herein.

Advantageously, it has now been found that such "imagewise exposure," development and subsequent curing step not only helps in fixing the image, it also facilitates thermal flowing properties of the film to form the desired microlens array. That is, as described hereinabove the films are generally exposed to suitable radiation using a suitable mask to form a microlens array, such as for example having the checker board configuration, as is well known in the art to form microlens configuration for color filter applications, see for example, U.S. Pat. Nos. 7,575,854 B2 and 7,884,435 B2. The exposed film is then developed as described hereinabove. The developed checker board images are generally a series of pillars and trenches with sharp edges and are generally of sub-micron resolution.

The developed images are then subjected to a curing step as described hereinabove. In this step, surprisingly, it has now been found that the sharp edges of the pillars are reshaped by thermal flow of the polymer to form rounded lens shape, thus providing an array of microlens suitable for color filter applications.

It has further been found that the formation of the microlens array depends upon the glass transition temperature of the polymer employed. Generally it has been found that glass temperature ($T_g$) of the polymer in the range of 160° C. to 210° C. facilitates the formation of microlens array. Accordingly, in some embodiments, the $T_g$ of the polymer is 160° C. to 210° C., in some other embodiments, the $T_g$ of the polymer is 170° C. to 200° C., and yet in some other embodiments, the $T_g$ of the polymer is 180° C. to 190° C.

Accordingly, in some embodiments the resulting imagewise film or layer is cured by heating the patterned and developed substrate at a temperature of from about 170° C. to about 220° C. for about 20 minutes to about 240 minutes. In some other embodiments such curing is carried out at a temperature of from about 180° C. to about 210° C. for about 30 minutes to about 180 minutes. In yet some other embodiments such curing is carried out at a temperature of from about 190° C. to about 200° C. for about 60 minutes to about 120 minutes. Finally, in some other embodiments of this invention, the curing is performed at a temperature of from about 130° C. to about 200° C. at an incremental heating ramp of about 5° C./minute and for about 1 to 3 hours. In some other embodiments the pattern reflow is completely absent after curing step, which means that pattern integrity is maintained, thus providing image resolution of about 10 µm or less. In some other embodiments the image resolution is about 5 µm or less. In some other embodiments the image resolution is less than 5 µm, less than 2 µm or less than 1 µm.

Further, the imaged and cured microlens array thus formed is solvent resistant and a further layer of polymer composition containing a different dye can then be formed on such an imaged surface. Accordingly, in a further embodiment of this invention there is provided a plurality of imaged polymer layers with a series of microlens arrays containing different dyes such as for example black, red, green and blue layers, generally known in the art as RGB color filters, and the like. Generally, the black layer is formed first so as to prevent any leakage of backlight and then series of red, green and blue dye containing layers are formed thereon. It should be understood that each of these layers are formed by coating a new layer, exposing said layer to suitable radiation, developing the layer and curing as described herein. Accordingly, in forming these plurality of layers the masks employed in forming each layer may be different. Similarly, the curing step may or may not involve additional thermal flowing strep to form the microlens in each of these steps. Finally, additional layers of dielectric layers may be placed at any of these layers depending upon the use and/or to provide the intended benefit or application.

The devices are produced by using embodiments of the photosensitive resin composition of the present invention to form layers which are characterized as having improved thermal properties, high resolution, and can be formed into rounded lens shaped checkerboards which are useful in forming color filters and microlens having a wide variety of applications.

Accordingly, in some of the embodiments of this invention there is also provided a color filter-microlens product obtained by the composition of this invention. In another embodiment there is also provided an optoelectronic or microelectronic device comprising the color filter-microlens product of this invention as described herein.

The following examples are detailed descriptions of methods of preparation and use of certain compounds/monomers, polymers and compositions of the present invention. The detailed preparations fall within the scope of, and serve to exemplify, the more generally described methods of preparation set forth above. The examples are presented for illustrative purposes only, and are not intended as a restriction on the scope of the invention. As used in the examples and throughout the specification the ratio of monomer to catalyst is based on a mole to mole basis.

EXAMPLES

The following abbreviations have been used hereinbefore and hereafter in describing some of the compounds, instruments and/or methods employed to illustrate certain of the embodiments of this invention:
NB—bicyclo[2.2.1]hept-2-ene; PENB—5-phenethylbicyclo[2.2.1]hept-2-ene; HFANB—norbornenyl-2-trifluoromethyl-3,3,3-trifluoropropan-2-ol; NBEtCOOH—norbornenylpropanoic acid; DecNB—5-decylbicyclo[2.2.1]hept-2-ene; NBTON—5-((2-(2-methoxyethoxy)ethoxy)methyl) bicyclo[2.2.1]hept-2-ene; MA—maleic anhydride; MeOH—methanol; BuOH—n-butanol; TMPTGE—2,2'-(((2-ethyl-2-((oxiran-2-ylmethoxy)methyl)propane-1,3-diyl)bis(oxy))bis(methylene))bis(oxirane); GE-36—triglycidyl ether of poly(oxypropylene)epoxide ether of glycerol; EPON 862—bis(4-(oxiran-2-ylmethoxy)phenyl)methane; Si-75—((triethoxysilyl)propyl)disulfide; KBM-403E—3-glycidoxypropyl trimethoxysilane; Megaface MF-556—oligomer with fluoro, hydrophilic and lipophilic group from DIC Corp.; O,O'-BPF—2,2'-methylenediphenol; GBL—γ-butyrolactone; PGMEA—propylene glycol methyl ether acetate; TrisP3M6C-2-201—the PAC of formula (IVo) as described herein; ROMA—ring opened maleic anhydride polymer with an alcohol; phr—parts per hundred parts resin; R. T.—room temperature; LC-MS: liquid chromatography-mass spectroscopy; SEM—scanning electron microscopy; GPC: gel permeation chromatography; $M_w$—weight average molecular weight; PDI—polydispersity index; pphr: parts per hundred parts of resin.

The following examples describe the procedures used for the preparation of various polymers as disclosed herein in the preparation of the compositions of this invention. However, it should be noted that these examples are intended to illustrate the disclosure without limiting the scope thereof.

Polymer Examples

The polymers used to form the photosensitive compositions of this invention are generally known in the literature and are prepared in accordance with the well-known literature procedures. See for example, the U.S. Pat. No. 8,715, 900 for all synthetic procedures related to ROMA polymers.

Photoimagable Polymer Composition and Imaging Studies

The following Examples illustrate the formation and imageability of the compositions of this invention with a variety of colorants and other components as described herein.

Examples 1A to 1G

A fully ring opened copolymer having the monomer composition of 50:50 molar ratio of PENB/MA ring opened with methanol ($M_w$ 8,900 and PDI 2.1 for Examples 1A, 1C and 1D and $M_w$=8,600 and PDI=1.9 for Examples 1B, 1E 1F and 1 G, repeat units of formula (IIA) where Z is O and $R_7$ is methyl) (100 parts resin by weight) was dissolved in PGMEA (400 parts). Then specific amounts of colorants, expressed as parts per hundred resin (pphr) as summarized in Table 1 were mixed with each of the polymer solutions in an appropriately sized amber HDPE bottle. Solutions in example 1B and 1E were heated at 60° C. for one hour. Solutions in Examples 1A, 1C and 1D were heated at 60° C. for 4 hours. Solutions in examples 1F and 1G were not heated. All solutions stirred overnight at ambient temperature after heating and particle contamination was removed by filtering the polymer solutions through a 0.2 μm pore polytetrafluoroethylene (PTFE) disc filter.

TABLE 1

| Example No. | Colorant | Color | Amount |
|---|---|---|---|
| 1A | Savinyl Fire Red | Red | 150 pphr |
| 1B | Orasol Red | Red | 100 pphr |
| 1C | Microlith Green | Green | 150 pphr |
| 1D | Orasol Blue 855 | Cyan | 150 pphr |
| 1E | Sudan Blue | Blue | 80 phr |
| 1F | Polysanthren Blue | Blue | 75 pphr |
| 1G | Orasol Black X51 | Black | 50 pphr |

Examples 2A and 2B

Compositions without Colorants

Two batches of compositions were formed without any colorants as follows. A fully ring opened copolymer having the monomer composition of 50:50 molar ratio of NB/MA ring opened with n-butanol ($M_w$ 11,600 and PDI 2.1, repeat units of formula (IIA) where Z is O and $R_7$ is n-butyl) (100 parts resin by weight) was dissolved in PGMEA (400 parts) (Example 2A). Similarly a second batch of polymer solution was formed by using a fully ring opened copolymer having the monomer composition of 50:50 molar ratio of PENB/MA ring opened with methanol ($M_w$ 8,200 and PDI 1.9, repeat units of formula (IIA) where Z is O and $R_7$ is methyl) (Example 2B). Then, to each of these polymer solutions were added specific amounts of additives, expressed as parts per hundred resin (pphr): TrisP3M6C-2-201 (27.5 pphr) as a photo-active compound, TMPTGE (20 pphr) as an epoxide cross-linker, KBM-403E (3 pphr) and Si-75 (3 pphr) as adhesion promoters were mixed in an appropriately sized amber HDPE bottles. The mixtures were rolled for 18 hours to produce homogeneous solutions. Particle contamination was removed by filtering the polymer solutions through 0.2 μm pore polytetrafluoroethylene (PTFE) disc filters. The filtered polymer solutions were collected in low particle HDPE amber bottles and stored at 5° C.

Examples 3A-3C

Compositions with Colorants

A fully ring opened copolymer having the monomer composition of 50:50 molar ratio of PENB/MA ring opened with methanol ($M_w$ 8,600 and PDI 1.9 for Examples 3A and 3B and $M_w$=8,200 and PDI=1.9 for Example 3C, repeat units of formula (IIA) where Z is O and $R_7$ is methyl) (100 parts resin by weight) was dissolved in PGMEA (400 parts). Then specific amounts of colorants, expressed as parts per hundred resin (pphr) as summarized in Table 2 were mixed with each of the polymer solutions in an appropriately sized amber HDPE bottle along with other additives: TrisP3M6C-2-201 (30 pphr) as a photo-active compound, TMPTGE (30 pphr) as epoxide cross-linker, KBM-403E (3 pphr) and Si-75 (3 pphr) as adhesion promoters and Megaface MF-556 (0.3 pphr) as a surface leveling agent were mixed in an appropriately sized amber HDPE bottles. The mixtures were rolled for 18 hours to produce homogeneous solutions. Particle contamination was removed by filtering the polymer solutions through 0.2 μm pore polytetrafluoroethylene (PTFE) disc filters. The filtered polymer solutions were collected in low particle HDPE amber bottles and stored at 5° C.

TABLE 2

| Example No. | Colorant | Colorant Amount | Color |
|---|---|---|---|
| 3A | Savinyl Fire Red | 50 phr | Red |
| 3B | Polysanthren Blue | 50 phr | Blue |
| 3C | Orasol Blue 855 | 100 phr | Cyan |

Example 4

Composition Containing Orasol Black X51

A fully ring opened copolymer having the monomer composition of 50:50 molar ratio of PENB/MA ring opened with methanol ($M_w$ 8,900 and PDI 2.1, repeat units of formula (IIA) where Z is O and $R_7$ is methyl) (100 parts resin by weight) was dissolved in PGMEA (400 parts). Then to this solution was added specific amounts of additives, expressed as parts per hundred resin (phr): Orasol Black X51 (50 pphr) as the black colorant, TrisP3M6C-2-201 (30 pphr) as a photo-active compound, GE-36 (30 pphr) and EPON-862 (20 pphr) as epoxide cross-linkers, ICBM-403E (3 pphr) and Si-75 (3 pphr) as adhesion promoters, Megaface MF-557 (0.3 pphr) as a surface leveling agent and GBL (100 pphr) were mixed in an appropriately sized amber HDPE bottle. The mixture was rolled for 18 hours to produce a homogeneous solution. Particle contamination was removed by filtering the polymer solution through a 0.2 μm pore polytetrafluoroethylene (PTFE) disc filter. The filtered polymer solution was collected in a low particle HDPE amber bottle and stored at 5° C.

Examples 5A and 5B

Compositions Containing Savinyl Fire Red

A fully ring opened copolymer having the monomer composition of 50:50 molar ratio of PENB/MA ring opened with n-butanol ($M_w$ 11,500 and PDI 2.1, repeat units of formula (IIA) where Z is O and $R_7$ is n-butyl) (100 parts resin by weight) was dissolved in PGMEA (400 parts). Then to this solution was added specific amounts of additives, expressed as parts per hundred resin (pphr): Savinyl Fire Red (150 pphr) as the red colorant, TrisP3M6C-2-201 (30 pphr) as a photo-active compound, GE-36 (30 pphr) and EPON-862 (20 pphr) as epoxide cross-linkers, KBM-403E (3 pphr) and Si-75 (3 pphr) as adhesion promoters, and GBL (100 pphr) were mixed in an appropriately sized amber HDPE bottle (example 5A). Additionally O,O-BPF (2.5 phr) as a dissolution promoter was included in example 5B. The mixtures were rolled for 18 hours to produce a homogeneous solutions. Particle contamination was removed by filtering the polymer solutions through 0.2 μm pore polytetrafluoroethylene (PTFE) disc filters. The filtered polymer solutions were collected in low particle HDPE amber bottles and stored at 5° C.

Examples 6A and 6B

Compositions Containing Savinyl Fire Red

A fully ring opened copolymer having the monomer composition of 50:50 molar ratio of NB/MA ring opened with n-butanol ($M_w$ 11,500 and PDI 2.1, repeat units of formula (IIA) where Z is O and $R_7$ is n-butyl) (100 parts resin by weight) was dissolved in PGMEA (400 parts). Then to this solution was added specific amounts of additives, expressed as parts per hundred resin (pphr): Savinyl Fire Red (100 pphr) as the red colorant, TrisP3M6C-2-201 (30 pphr) as a photo-active compound, GE-36 (30 pphr) and EPON-862 (20 pphr) as epoxide cross-linkers, ICBM-403E (3 pphr) and Si-75 (3 pphr) as adhesion promoters, and GBL (300 pphr) were mixed in an appropriately sized amber HDPE bottle (Example 6A). A substantially similar composition was also prepared by using a fully ring opened copolymer having the monomer composition of 50:50 molar ratio of PENB/MA ring opened with methanol ($M_w$ 8,200 and PDI 1.9, repeat units of formula (IIA) where Z is O and $R_7$ is methyl) (Example 6B). The mixtures were rolled for 18 hours to produce homogeneous solutions. Particle contamination was removed by filtering the polymer solutions through 0.2 μm pore polytetrafluoroethylene (PTFE) disc filters. The filtered polymer solutions were collected in a low particle HDPE amber bottle and stored at 5° C.

Example 7A

Visible Spectra of Colorant/Polymer Solutions

Solutions of Examples 1A through 1G were spin coated on 4-inch glass wafer and post apply baked (PAB) to obtain a film having thicknesses in 0.7-1.5 μm range. The transparencies (% T) of the films were measured in 400-700 nm wavelength range using Agilent Cary 100 UV-Visible Spectrophotometer. The % T values were normalized to 1 μm film thickness for all of the samples. FIG. 1 shows the spectra of examples 1A (red), 1C (green) and 1E (blue). These spectral characteristics are suitable for color filter applications where transparent and opaque regions of red, green and blue spectra are sufficiently separated. Similar color separations were seen with examples 1B, 1D and 1F. FIG. 1 also shows the visible spectra of Example 1G (black) where the transparency of the film is low in 400-700 nm wavelength region.

Example 7B

Visible Spectra of Composition Containing Red Colorant

A solution of Example 5A was spin coated on 4-inch glass wafers and post apply baked (PAB) to obtain a film having thickness of 1.03 μm. The transparency (% T) of the film was measured in 400-700 nm wavelength range using Agilent Cary 100 UV-Visible Spectrophotometer. The % T values were normalized to 1 μm film thickness for all of the samples. The transparency at 400 through 575 nm wave length region was less than 3%. The transparency increased rapidly to higher than 90% when the wavelength increased from 575 nm to 640 nm. The transparency remained higher than 90% from 640 nm to 700 nm. This shows the suitability of this red colorant for color filter applications. Similarly solution of Example 5B was spin coated on 4-inch glass wafers and post apply baked (PAB) to obtain two films having thicknesses of about 1.8 μm each. The transparency (% T) of the films were measured in 400-700 nm wavelength range using Agilent Cary 100 UV-Visible Spectrophotometer. The % T values were normalized to 1 μm film thickness for all of the samples. One of the wafers was cured in an oven under nitrogen and the other one was cured in air using a hot plate at 220° C. for 1 hour each. The transparencies of the films were measured and normalized to 1 μm film thicknesses. The decrease in transparency in 400-700 nm region for the film cured in a nitrogen atmosphere was about one percent (1%) and for the film cured in air was about two percent (2%). This shows the suitability of this red colorant for color filter applications where a cure step is needed to generate red permanent material.

Example 8

Transparency of Compositions Containing No Colorants

Compositions of Examples 2A and 2B were spin coated on 4-inch glass wafers and post apply baked to obtain films having thicknesses of 1 to 1.2 μm range. The transparencies (% T) of the films were measured in 400-700 nm wavelength range using Cary 100 UV-Visible Spectrophotometer and the % T values were normalized to 1 μm film thickness. Both films had high transparencies of higher than 98% in 400-700 nm wavelength range. Both films were exposed at 1 $J/cm^2$ using a broad band Hg vapor light source (g, h and i bands) at 365 nm using a band pass filter. The films were then cured in an oven under nitrogen atmosphere at 200° C. for one hour and the transparency measurements were repeated. Both films retained high transparency of higher than 97% in 400-700 nm wavelength range. Transparencies of 99.5% and 98.1% were obtained at 400 nm wavelength for films of Examples 2A and 2B respectively after cure. This Example demonstrates the suitability of NB/ROMA-BuOH and PENB/ROMA-MeOH polymers for color filter applications. This Example also demonstrates the suitability of components used for positive tone imagable compositions for color filter applications. The polymer or any of the components used in the composition did not have notable absorbance at 400 to 700 nm wave length region at which color filters operate.

Photo Imaging Studies

Example 9

Compositions from Examples 3A through 3C were spun onto 4 inch thermal oxide silicon wafers at 750 rpm for 30 seconds first and another 30 seconds at 2500 rpm (example 9A), 2000 rpm (example 9B) or 3000 rpm (example 9C). These films were post apply baked (PAB) for 3 minutes at 115° C. (Example 9A), 90° C. (Example 9B) and 120° C. (Example 9C). These wafers were exposed using a stepper to broad band Hg vapor light source (g, h and i bands) at 365 nm by means of a band pass filter through a mask to generate trenches and contact holes. The exposed substrates were immersed in developer (2.38 wt. % TMAH) for various times (immersion development).

In general, all of the samples exhibited good film properties. The resolution of the patterns formed by exposure and development were determined by an optical microscope or SEM. The photo imaging properties of the composition Examples 3A, 3B and 3C are summarized in Table 3. This Example 9 demonstrates the viability of using the above mentioned colorants, polymers and formulation components for high resolution imaging suitable for color filter applications.

TABLE 3

| Example | FT (μm) | Minimum Contact hole (μm) | Minimum Trench (μm) |
|---------|---------|---------------------------|---------------------|
| 9A | 1.18 | 1 | 0.5 |
| 9B | 1.38 | 1.5 | 0.8 |
| 9C | 0.75 | 1 | 0.7 |

FT—film thickness

Example 10

Figure 2:
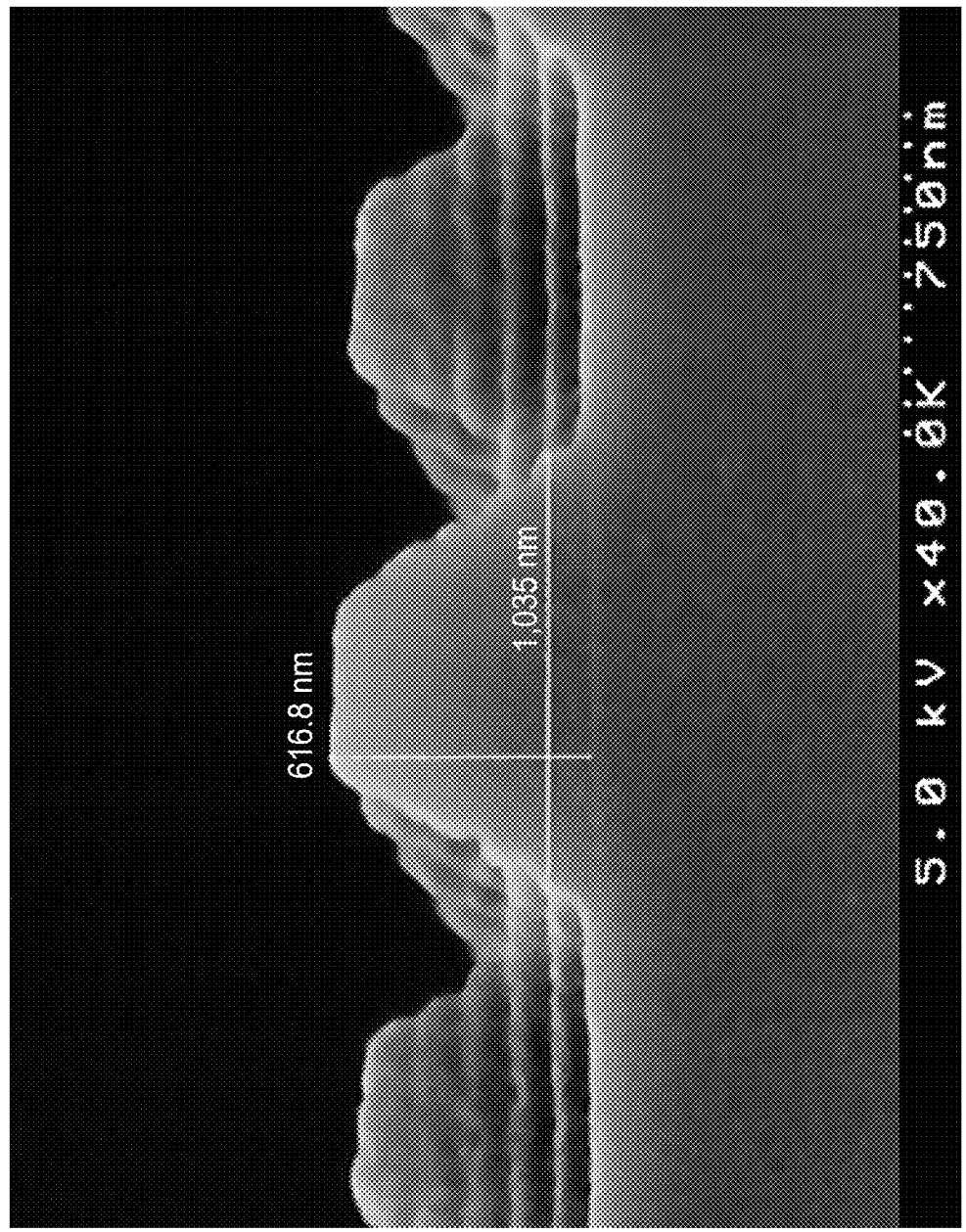
FIG. 2 shows the cross section scanning electron micrograph (SEM) of the checker board images formed from a composition embodiment of this invention.

Composition from Example 4 was spun onto 4 inch thermal oxide silicon wafers at 500 rpm for 30 seconds first and another 30 seconds at 600 rpm. This film was post apply baked (PAB) for 3 minutes at 110° C. to obtain a film thickness of 0.91 μm. This wafer was exposed using a stepper to broad band Hg vapor light source (g, h and i bands) at 365 nm by means of a band pass filter through a mask to generate a checkerboard pattern of alternating pillars and contact holes suitable for color filter applications. The exposed substrates were immersed in developer (2.38 wt. % TMAH) for 30 seconds (immersion development) to reveal the checkerboard pattern at 0.61 μm film thickness. The unexposed area film thickness loss or dark field loss (DFL) based on the film thicknesses before and after development was 33%. FIG. 2 shows a SEM cross section of the aforementioned checkerboard pattern at 1 μm resolution at 225 mJ/cm$^2$ exposure dose. Also the SEM profiles of these patterns showed the effects of standing waves where the presence of alternating horizontal lines due to slight differences in dissolution rates in the developer. This Example demonstrates the viability of using a black dye in color filter applications.

Example 11

Composition from Example 5B was spun onto 4 inch thermal oxide silicon wafers at 500 rpm for 30 seconds first and another 30 seconds at 4000 rpm. This film was post apply baked (PAB) for 3 minutes at 105° C. to obtain a film thickness of 0.86 μm. This wafer was exposed using a stepper to broad band Hg vapor light source (g, h and i bands) at 365 nm using a band pass filter through a mask to generate a checkerboard pattern (alternating pillars and contact holes) and semi-dense (1:2 pitch) pillars suitable for color filter applications. The exposed substrates were immersed in developer (2.38 wt. % TMAH) for 18 seconds (immersion development) to reveal the pattern at 0.81 μm film thickness. The unexposed area film thickness loss or dark field loss (DFL) based on the film thicknesses before and after development was 6%. SEM top-down images showed the formation of the aforementioned checkerboard pattern and semi-dense pillars at 0.6 μm resolution at 450 mJ/cm$^2$ exposure dose. This Example 11 demonstrates the viability of using a red dye in color filter applications.

Example 12

Figure 3:
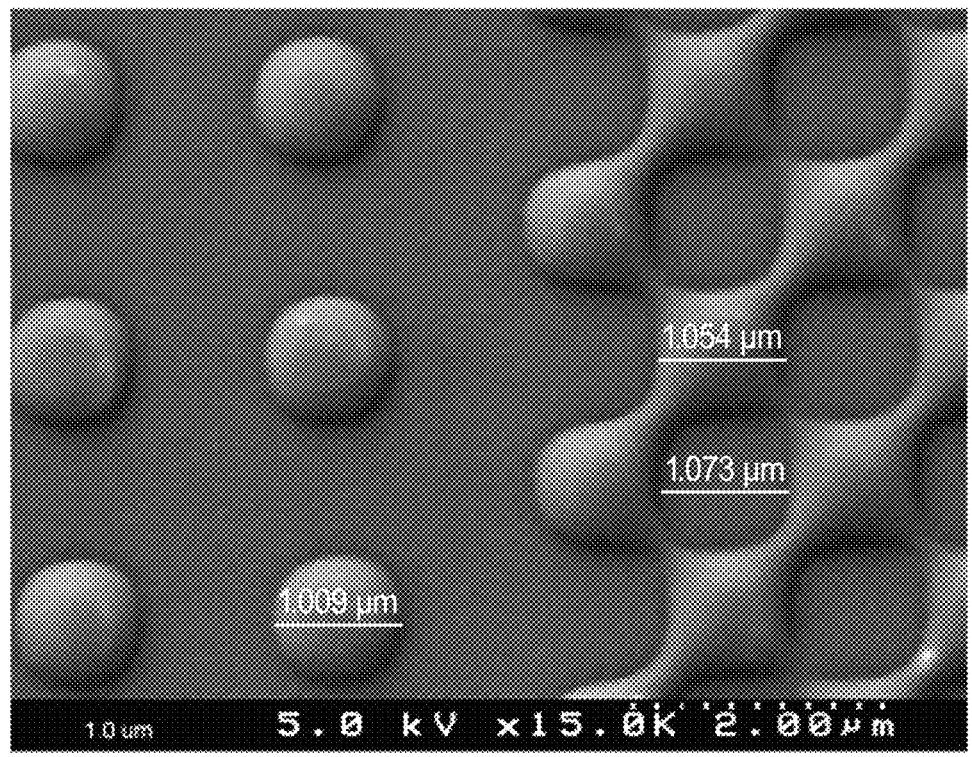
FIG. 3 shows the top down SEM micrograph of a microlens/checkerboard configuration obtained with a composition embodiment of this invention after thermal flow.
Figure 4:
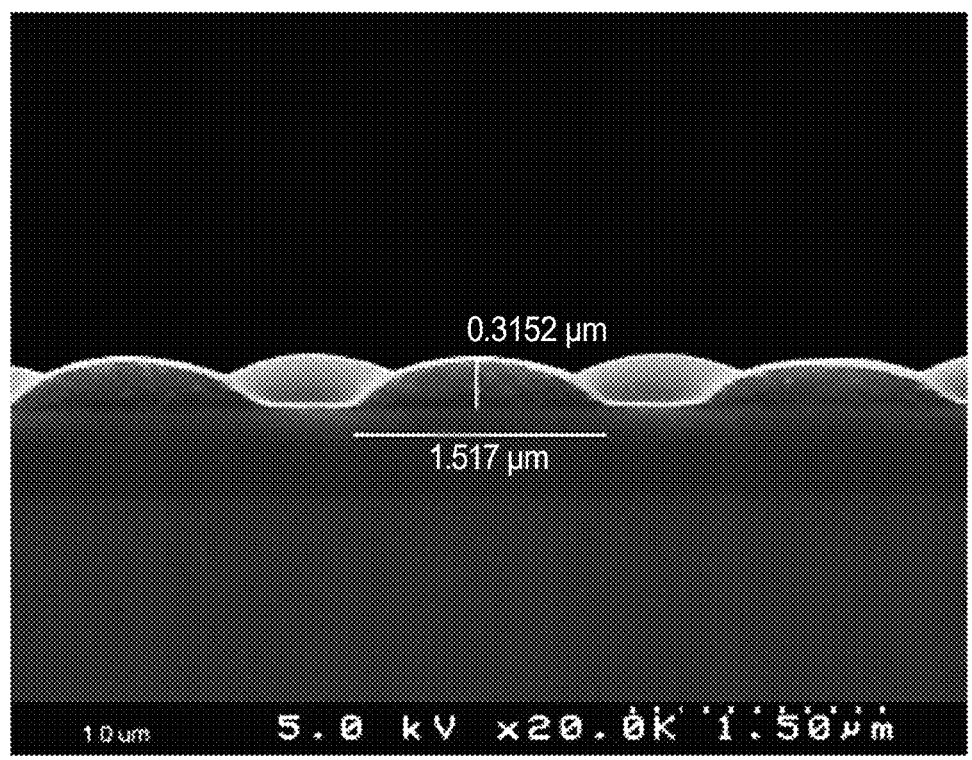
FIG. 4 shows the cross section SEM micrograph of a microlens/checkerboard configuration obtained with a composition embodiment of this invention.

Compositions from Examples 6A and 6B were spun onto 4 inch thermal oxide silicon wafers at 500 rpm for 30 seconds first and another 30 seconds at 2500 rpm. These films were post apply baked (PAB) for 3 minutes at 110° C. These wafers were exposed using a stepper to broad band Hg vapor light source (g, h and i bands) at 365 nm using a band pass filter through a mask to generate a checkerboard pattern (alternating pillars and contact holes) and semi-dense (1:2 pitch) pillars suitable for color filter applications. The exposed substrates were immersed in developer (2.38 wt. % TMAH) to reveal the patterns. Some exposed substrates were further subjected to a post exposure bake (PEB) for one minute at 90° C. before development. The photo-imaging properties of these films were evaluated by measuring dark field loss (DFL) and are summarized in Table 4. Checkerboard and semi-dense (1:2 pitch) pillar patterns with sharp edges were observed for all films at sub-micron resolution. Also the SEM profiles of these patterns showed the effects of standing waves where the presence of alternating horizontal lines due to slight differences in dissolution rates in the developer. Similar standing wave effect is also shown in FIG. 2 for example 10. When these films were subjected to additional cure step for 1 hour at 200° C. the sharp edges of the patterns became rounded (lens shapes) by thermal flow effects while retaining checkerboard configurations. The effects from standing waves were also erased. FIG. 3 shows top-down SEM images of such micro-lens/checkerboard configurations after thermal flow for example 12B at about 1 μm resolution. FIG. 4 shows cross-sectional SEM images of checkerboard configurations after thermal flow for Example 12D at about 1 μm resolution. This Example 12 illustrates the feasibility of generating such micro-lens/color filter hybrid features using various compositions of this invention.

TABLE 4

| Example No. | Composition Example No. | FT (μm) | PEB | Development (sec) | FT (μm) | DFL |
|-------------|-------------------------|---------|-----|-------------------|---------|-----|
| 12A | 6A | 1.01 | None | 46 | 0.83 | 18% |
| 12B | 6A | 0.94 | 90° C./1 minute | 30 | 0.79 | 16% |
| 12C | 6B | 0.94 | None | 75 | 0.85 | 10% |
| 12D | 6B | 0.97 | 90° C./1 minute | 105 | 1.14 | swelled |

FT—film thickness;
PEB—post exposure bake;
DFL—dark field loss

Example 13

Glass Transition Temperature Measurements

Glass transition temperatures were measured by thermo-mechanical analysis (TMA) for cured films at 200° C. for 1 hour formed from the compositions of Comparative Examples 1A, 1B, 2, 3 and which are compared with Example 6B. The glass transition temperatures and the thermal flow characteristics of imaged films during the cure step at 200° C. for 1 hour are summarized in Table 5. As it is apparent from the results summarized in Table 5, the thermal flow of the imaged films is too high when the glass transition temperature is low, such as for example at around 147° C. in Example 13D using the composition of Comparative Example 1B. The thermal flow of the imaged films is too low when the glass transition temperature is high, such as for example at around 226° C. in Example 13A using the composition of Comparative Example 2. Example 13C employing NB/ROMA-BuOH with a glass transition temperature of 198° C. had good thermal flow for microlens formation while similar composition employing PENB/ROMA-MeOH in example 13D with a glass transition temperature of 147° C. had high thermal flow making this film unsuitable for microlens formation. However, with the addition of Savinyl Fire red colorant to this composition (Example 13E) increased the glass transition temperature to 163° C. making it suitable for color filter/microlens formation. This Example 13 demonstrates that the glass transition temperature of the cured film needs to be optimized either by changing the ROMA polymer composition, epoxy cross linker combination or adding a suitable colorant.

TABLE 5

| Example | Polymer | Composition Example No. | Tg (° C.) | Thermal flow | FIG. |
|---|---|---|---|---|---|
| 13A | NB/ROMA-BuOH | Comparative Ex. 2 | 226 | Too low | 5 |
| 13B | NB/ROMA-BuOH | Comparative Ex. 3 | 200 | Good | 6 |
| 13C | NB/ROMA-BuOH | Comparative Ex. 1A | 198 | Good | — |
| 13D | PENB/ROMA-MeOH | Comparative Ex. 1B | 147 | Too high | — |
| 13E | PENB/ROMA-MeOH | 6B | 163 | Good | 4 |

Examples 14A-14C

Solvent Resistance Studies

These Examples 14A to 14C illustrate that the compositions of this invention can be cured so as to obtain a polymeric layer which is resistant to the solvents normally used to form the compositions of this invention. These Examples 14A to 14C further illustrate that a second coating of the polymeric layer containing the composition of this invention can be readily formed on top of the first layer thereby demonstrating that a plurality of layers containing various dyes needed for the color filter applications can thus be readily fabricated.

In three separate batches, a fully ring opened copolymer having the monomer composition of 50:50 molar ratio of PENB/MA ring opened with methanol (100 parts resin by weight) was mixed with 50 parts Savinyl Fire Red (Example 14A), 50 parts Polysanthren Blue (Example 14B) and 100 parts Orasol Blue 855 (Example 14C) and dissolved in PGMEA (550 parts). Then specific amounts of additives, expressed as parts per hundred resin (pphr) were mixed with each of these three polymer solutions in appropriately sized amber HDPE bottles: TrisP3M6C-2-201 (30 pphr) as a photo-active compound, TMPTGE (30 pphr for Examples 14A and 14B and 35 pphr for example 14C) and GE-36 (10 pphr for Examples 14A and 14B and 15 pphr for Example 14C) as epoxide cross-linkers, KBM-403E (3 pphr) and Si-75 (3 pphr) as adhesion promoters, Megaface MF-556 (0.3 pphr) as a surface leveling agent and PGMEA (150 phr). The mixtures were rolled for 18 hours to produce homogeneous solutions. Particle contamination was removed by filtering the polymer solutions through 0.2 μm pore polytetrafluoroethylene (PTFE) disc filters. The filtered polymer solutions were collected in low particle HDPE amber bottles and stored at 5° C.

Compositions from Examples 14A, 14B and 14C were spun onto 4 inch thermal oxide silicon wafers at 500 rpm for 10 seconds first and another 30 seconds at 1000 rpm. These films were post apply baked (PAB) for 3 minutes at 120° C. The films were then subjected to additional cure step for 1 hour at 200° C. and immersed in PGMEA for 10 minutes. Film thicknesses were measured after cure step and PGMEA immersion. The film thickness change of about 1% loss (Example 14A), 21% loss (Example 14B) and 2% swelling (Example 14C) after PGMEA immersion demonstrates that the cured films are essentially insoluble in PGMEA. This indicates that 1 hour at 200° C. cure step is sufficient to cross link the films to generate a permanent material. Subsequently, a second coating was applied to cured films of Examples 14A, 14B and 14C by spin coating at 500 rpm for 10 seconds first and another 30 seconds at 1000 rpm. These $2^{nd}$ coated films were post apply baked (PAB) for 3 minutes at 120° C. The total film thicknesses after the double coatings increased by 92% (Example 14A), 98% (Example 14B) and 115% Example 14C. The results are summarized in Table 6.

TABLE 6

| Example No. | Example 14A | Example 14B | Example 14C |
|---|---|---|---|
| FT after Cure (μm) | 1.092 | 0.59 | 1.292 |
| FT after PGMEA immersion (μm) | 1.086 | 0.468 | 1.321 |
| FT change after PGMEA immersion | 1% loss | 21% loss | 2% gain |
| FT after $2^{nd}$ coating (μm) | 2.099 | 1.167 | 2.775 |
| Total FT increase after double coating | 92% | 98% | 115% |

FT—film thickness

Comparative Examples 1A and 1B

Composition without Savinyl Fire Red

The procedures of Example 6 was substantially followed except that Savinyl Fire Red was not used in these Comparative Examples 1A and 1B. 20 wt. % solutions of NB/ROMA-BuOH (Comparative Example 1A, $M_w$=11,500 and PDI=2.1) or PENB/ROMA-MeOH (Comparative Example 1B, $M_w$=8,200 and PDI=1.9) in PGMEA were formulated having the specific amounts of additives, expressed as parts per hundred resin (pphr): TrisP3M6C-2-201 (30 pphr) as a photo-active compound, GE-36 (30 pphr) and EPON-862 (20 pphr) as epoxide cross-linkers, KBM-403E (3 pphr) and Si-75 (3 pphr) as adhesion promoters, and GBL (300 pphr) were mixed in an appropriately sized amber HDPE bottles. The mixtures were rolled for 18 hours to produce homogeneous solutions. Particle contamination was removed by filtering the polymer solutions through 0.2 μm pore polytetrafluoroethylene (PTFE) disc filters. The filtered polymer solutions were collected in a low particle HDPE amber bottles and stored at 5° C.

Comparative Example 2

Composition without Savinyl Fire Red

A 30 wt. % solution of NB/ROMA-BuOH ($M_w$=11,600 and PDI=2.1) in PGMEA was mixed with specific amounts of additives, expressed as parts per hundred resin (pphr): TrisP3M6C-2-201 (27.5p phr) as a photo-active compound, TMPTGE (35 pphr) as an epoxide cross-linker and Si-75 (3 pphr) as an adhesion promoter were mixed in an appropriately sized amber HDPE bottles. The mixture was rolled for 18 hours to produce homogeneous solutions. Particle contamination was removed by filtering the polymer solutions through 5 μm pore polytetrafluoroethylene (PTFE) disc filters. The filtered polymer solution was collected in a low particle HDPE amber bottle and stored at 5° C.

Comparative Example 3

Composition without Savinyl Fire Red

A 30 wt. % solution of NB/ROMA-BuOH ($M_w$=11,600 and PDI=2.1) in PGMEA was mixed with specific amounts of additives, expressed as parts per hundred resin (pphr): TrisP3M6C-2-201 (27.5 pphr) as a photo-active compound, EPON-862 (40 pphr) and Heloxy-65 (10 pphr) as epoxide cross-linkers and Si-75 (3 pphr) as an adhesion promoter were mixed in an appropriately sized amber HDPE bottles. The mixture was rolled for 18 hours to produce homogeneous solution. Particle contamination was removed by filtering the polymer solutions through 5 μm pore polytetrafluoroethylene (PTFE) disc filters. The filtered polymer solutions was collected in a low particle HDPE amber bottles and stored at 5° C.

Comparative Examples 4A and 4B

Photo-Imaging of Composition from Comparative Example 1

Compositions from Comparative Examples 1A and 1B were spun separately onto two 4 inch thermal oxide silicon wafers at 500 rpm for 30 seconds first and another 30 seconds at 2000 rpm. These films were post apply baked (PAB) for 3 minutes at 110° C. These wafers were exposed using a stepper to broad band Hg vapor light source (g, h and i bands) at 365 nm using a band pass filter through a mask suitable for color filter applications to generate a checkerboard pattern (alternating pillars and contact holes), semi-dense (1:2 pitch) pillars, trenches and dense (1:1 pitch) contact holes. The exposed substrates were immersed in developer (2.38 wt. % TMAH) to reveal the patterns. The photo-imaging properties of these films are summarized in Table 7. The film thickness lost 53% in unexposed area (DFL) in Comparative Example 4A in 6 seconds whereas only 18% in 46 seconds was lost in Example 12A where Savinyl Fire Red was present. Likewise the DFL of 13% was observed in Comparative Example 4B in 25 sec development whereas only 10% DFL was observed in 75 seconds in Example 12C where Savinyl Fire Red was present. These examples demonstrate that the presence of Savinyl Fire Red colorant in the composition is advantageous and needed to minimize the DFL during aqueous base development. Both of the Comparative Examples 4A and 4B films imaged forming trenches and contact holes. Images of Comparative Example 4A were over-developed due to its high DFL so less than 5 μm contact holes with 1:1 pitch were not formed. Therefore the Comparative Example 1A composition that did not contain Savinyl Fire Red colorant is not suitable for color filter applications unlike Example 6A where a colorant was present. Comparative Example 4B did not suffer from such over-development so 1 μm checkerboard, semi-dense (1:2 pitch) pillars, dense 3 μm contact holes (1:1 pitch), and 3 μm trenches were formed even in the absence of a colorant. However, when the imaged wafer of Comparative Example 4B was cured at 200° C. for 1 hour an excessive thermal flow had occurred and features less than 5 μm, particularly contact holes, were erased. Therefore, the Comparative Example 1B is not suitable for color filter/microlens applications unlike Example 6B where a colorant was present. The glass transition temperature of a film generated by this composition was 147° C. as measured by thermo-mechanical analysis (TMA). Therefore the Comparative Example 6 demonstrates that not only the ROMA polymer and a suitable composition but a suitable colorant such as Savinyl Fire Red is needed for the formation of the color filter/microlens of this invention.

TABLE 7

| Comparative Example No. | Composition Example No. | FT (μm) | Development (sec) | FT (μm) | DFL |
|---|---|---|---|---|---|
| 4A | Comp. Example 1A | 0.81 | 6 | 0.38 | 53% |
| 4B | Comp. Example 1B | 0.67 | 25 | 0.58 | 13% |

FT—film thickness;
DFL—dark field loss

Comparative Example 5

Photo-Imaging of Composition from Comparative Example 2

Figure 5:
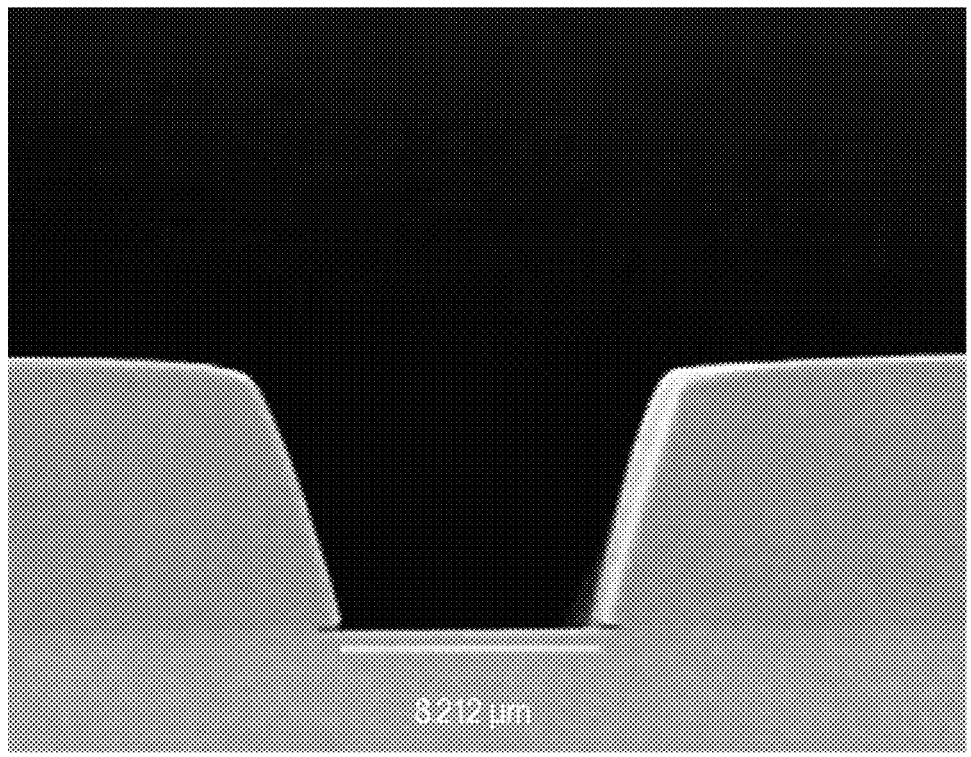
FIG. 5 shows the cross section SEM micrograph of a positive tone lithographic images of about 8 μm isolated trenches formed from one of the compositions from the comparative examples.

Composition from Comparative Example 2 was spun onto 4 inch thermal oxide silicon wafer and post apply baked (PAB) to obtain film with a thickness of about 10 μm having no visible roughness or haziness. This wafer was exposed using a mask aligner to broad band Hg vapor light source (g, h and i bands) at 365 nm using a band pass filter through a mask to generate isolated trenches ranging from 2-10 μm. The exposed substrates were immersed in developer (2.38 wt. % TMAH) to reveal the patterns. The imaged wafers were cured at 200° C. for 1 hour under nitrogen in an oven. FIG. 5 shows the cross-sectional SEM profile of a trench of about 8 μm in width. The profiles are not rounded as desired for color filter/microlens applications. The glass transition temperature of a cured film of a composition from Comparative Example 2 was measured by thermo-mechanical analysis (226° C. by TMA) and dynamic mechanical analysis (264° C. by DMA). This Comparative Example 5 demonstrates that the mere presence of ROMA polymers and any epoxy cross linker is not sufficient for forming the color filter-microlens but the film should feature a suitable glass transition temperature so that desired degree of thermal flow can occur during the cure step to form the microlens as described herein.

Comparative Example 6

Photo-Imaging of Composition from Comparative Example 3

Figure 6:
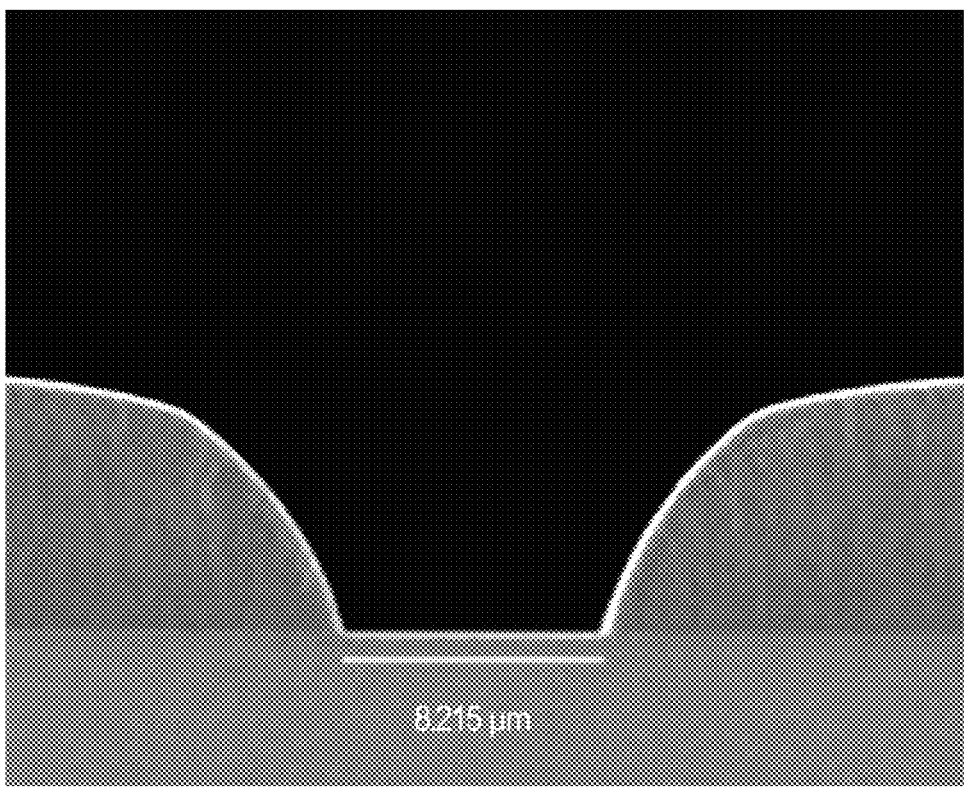
FIG. 6 shows the SEM cross section SEM micrograph of a positive tone lithographic images of about 8 μm isolated trenches formed from another composition from the comparative examples.

Composition from Comparative Example 3 was spun onto 4 inch thermal oxide silicon wafer and post apply baked (PAB) to obtain film with a thickness of about 10 μm having no visible roughness or haziness. This wafer was exposed using a mask aligner to broad band Hg vapor light source (g, h and i bands) at 365 nm using a band pass filter through a mask to generate isolated trenches ranging from 2-10 μm. The exposed substrates were immersed in developer (2.38 wt. % TMAH) to reveal the patterns. The imaged wafers were cured at 200° C. for 1 hour under nitrogen in an oven. FIG. 6 shows the cross-sectional SEM profile of a trench of about 8 μm in width. The profiles are sufficiently rounded as desired for color filter/microlens applications. The glass transition temperature of a cured film formed from a composition of Comparative Example 5 was measured by thermo-mechanical analysis (200° C. by TMA) and dynamic mechanical analysis (233° C. by DMA). This Comparative Example 6 demonstrates that the mere presence of ROMA polymers and any epoxy cross linker is not sufficient for the formation of the color filter-microlens but the epoxy cross linker combination must be tailored so that film would possess a suitable glass transition temperature so that desired degree of thermal flow can occur during the cure step.

In summary, the Comparative Examples 1 to 5 are provided herein to demonstrate that certain of the properties exhibited by the polymers and compositions of this invention including but not limited to thermal properties of the polymer used herein and certain of the surprising properties exhibited by the compositions of this invention makes it possible to tailor the compositions for various color filter applications as contemplated herein. However, it is possible that the compositions of the invention may possess various other properties that are suitable for these applications as well as various other potential applications beyond the applications contemplated herein. Nevertheless, Table 8 summarizes some of the advantageous results as described herein.

TABLE 7

| Example No. | Polymer Employed | Epoxy Employed | Dye | DFL | $T_g$ (° C.) | Thermal flow | Comment |
|---|---|---|---|---|---|---|---|
| Comp. Ex. 4A | NB/ROMA | GE + EPON | None | 53% | 198 | Good | Not suitable for imaging |
| Example 12A | NB/ROMA | GE + EPON | Red | 18% | — | Good | Suitable for CF-ML FIG. 3 |
| Comp. Ex. 4B | PENB/ROMA | GE + EPON | None | 12% | 147 | Too high | Not suitable for CF-ML |
| Example 12B | PENB/ROMA | GE + EPON | Red | 10% | 163 | Good | Suitable for CF-ML FIG. 4 |
| Comp. Ex. 5 | NB/ROMA | TMPTGE | None | 19% | 226 | Too low | Not suitable for micro-lens |
| Comp. Ex. 6 | NB/ROMA | EPON + Heloxy | None | 9% | 200 | Good | Suitable for micro-lens |

Although the invention has been illustrated by certain of the preceding examples, it is not to be construed as being limited thereby; but rather, the invention encompasses the generic area as hereinbefore disclosed. Various modifications and embodiments can be made without departing from the spirit and scope thereof.

What is claimed is:

1. A composition comprising:
   a) a polymer having one or more first repeating units represented by formula (IA), said first repeating unit is derived from a monomer of formula (I):

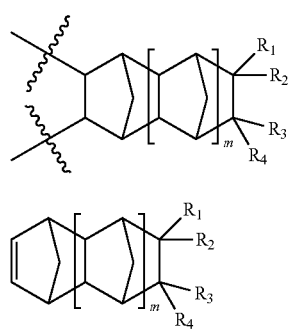

(IA)

(I)

wherein:

m is an integer 0, 1 or 2;

$R_1$, $R_2$, $R_3$ and $R_4$ are the same or different and each independently selected from the group consisting of hydrogen, halogen, linear or branched $(C_1$-$C_{12})$alkyl, hydroxy$(C_1$-$C_{12})$alkyl, perfluoro$(C_1$-$C_{12})$alkyl, $(C_3$-$C_{12})$cycloalkyl, $(C_6$-$C_{12})$bicycloalkyl, $(C_7$-$C_{14})$tricycloalkyl, $(C_6$-$C_{10})$aryl, $(C_6$-$C_{10})$aryl$(C_1$-$C_6)$alkyl, perfluoro$(C_6$-$C_{10})$aryl, perfluoro$(C_6$-$C_{10})$aryl$(C_1$-$C_3)$alkyl, $(C_5$-$C_{10})$heteroaryl, $(C_5$-$C_{10})$heteroaryl$(C_1$-$C_3)$alkyl, hydroxy, $(C_1$-$C_{12})$alkoxy, $(C_3$-$C_{12})$cycloalkoxy, $(C_6$-$C_{12})$bicycloalkoxy, $(C_7$-$C_{14})$tricycloalkoxy, $(C_6$-$C_{10})$aryloxy$(C_1$-$C_3)$alkyl, $(C_5$-$C_{10})$heteroaryloxy$(C_1$-$C_3)$alkyl, $(C_6$-$C_{10})$aryloxy, $(C_5$-$C_{10})$heteroaryloxy, $(C_1$-$C_6)$acyloxy, —$(CH_2)_a$—$C(CF_3)_2OR$, —$(CH_2)_a$—$CO_2R$, a group of formula (A):

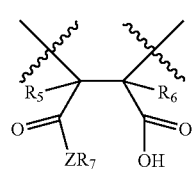

(A)

——$(CH_2)_b$——$(OCH_2$-$CH_2)_c$——OR; and a group of formula (B):

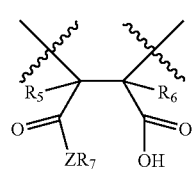

(B)

wherein:

a is an integer from 0 to 4 b is an integer from 0 to 10;

c is an integer 0, 1, 2, 3 or 4; and

R is selected from the group consisting of hydrogen, linear or branched $(C_1$-$C_6)$alkyl, $(C_5$-$C_8)$cycloalkyl, $(C_6$-$C_{10})$aryl and $(C_7$-$C_{12})$aralkyl; and one or more of a second repeating unit represented by formula (IIA) or (IIB), said second repeating unit is derived from a monomer of formula (II):

(IIA)

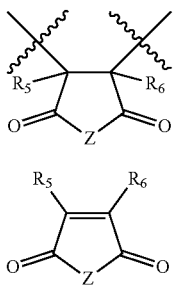

wherein:
Z is O or N—$R_8$ wherein $R_8$ is selected from the group consisting of hydrogen, linear or branched ($C_1$-$C_9$) alkyl, ($C_3$-$C_7$)cycloalkyl and ($C_6$-$C_{12}$)aryl;
$R_5$, $R_6$ and $R_7$ are each independently of one another selected from the group consisting of hydrogen, linear or branched ($C_1$-$C_9$)alkyl, fluorinated or perfluorinated ($C_1$-$C_9$)alkyl, ($C_6$-$C_{12}$)aryl and ($C_6$-$C_{12}$)aryl($C_1$-$C_{12}$) alkyl; and
wherein each of aforementioned groups, where valence is permissible, is optionally substituted with one or more groups selected from the group consisting of linear or branched ($C_1$-$C_6$)alkyl, ($C_3$-$C_7$)cycloalkyl, ($C_1$-$C_6$)perfluoroalkyl, ($C_1$-$C_6$)alkoxy, ($C_3$-$C_7$)cycloalkoxy, ($C_1$-$C_6$)perfluoroalkoxy, halogen, hydroxy, linear or branched hydroxy($C_1$-$C_6$)alkyl, acetoxy, phenyl, hydroxyphenyl and acetoxyphenyl;
b) a dye selected from the group consisting of red, green, blue, yellow, magenta, black and cyan colored dye material;
c) a photoactive compound; and
d) a carrier solvent.

2. The composition of claim 1, wherein Z is O, $R_5$ and $R_6$ are hydrogen, and $R_7$ is hydrogen or linear or branched ($C_1$-$C_9$)alkyl.

3. The composition of claim 1, wherein m=0, $R_1$, $R_2$, $R_3$ and $R_4$ independently represents hydrogen, hexyl, decyl, —($CH_2$)$_2$—$C(CF_3)_2$OH, —($CH_2$)$_2$—$CO_2$H, benzyl and phenethyl.

4. The composition of claim 1, wherein the polymer comprises one or more first repeat units derived from the corresponding monomers selected from the group consisting of:
bicyclo[2.2.1]hept-2-ene (NB);
norbornenyl-2-trifluoromethyl-3,3,3-trifluoropropan-2-ol (HFANB);
5-phenethylbicyclo[2.2.1]hept-2-ene (PENB); and
(NBTON).

5. The composition of claim 1, wherein the polymer comprises one or more second repeat units derived from the corresponding monomers selected from the group consisting of:
maleic anhydride; and
2-methyl-maleic anhydride.

6. The composition of claim 1, wherein the polymer is selected from the group consisting of:
a copolymer containing repeating units derived from 5-phenethylbicyclo[2.2.1]hept-2-ene and ring opened maleic anhydride repeat units which is ring opened with methanol;
a copolymer containing repeating units derived from bicyclo[2.2.1]hept-2-ene and ring opened maleic anhydride repeat units which is ring opened with n-butanol;
a terpolymer containing repeating units derived from 5-phenethylbicyclo[2.2.1]hept-2-ene, 5-decylbicyclo[2.2.1]hept-2-ene and ring opened maleic anhydride repeat units which is ring opened with methanol; and
a copolymer containing repeating units derived from 5-phenethylbicyclo[2.2.1]hept-2-ene (PENB) and ring opened maleic anhydride repeat units which is ring opened with n-butylamine.

7. The composition of claim 1, wherein the dye is selected from the group consisting of solvent dye, disperse dye, acid dye, basic dye, sulfur dye and vat dye.

8. The composition of claim 7, wherein the dye is miscible in the composition.

9. The composition of claim 1, wherein the dye is selected from the group consisting of:

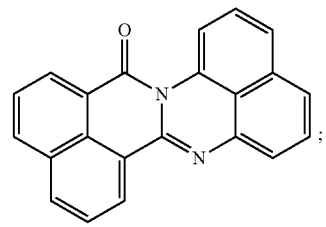

14H-benzo[4,5]isoquinolino[2,1-a]perimidin-14-one complexed with cobalt

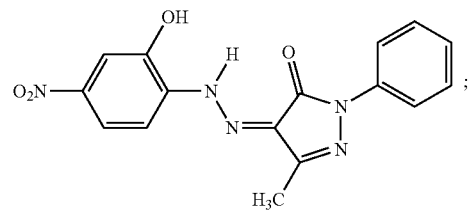

(Z)-4-(2-(2-hydroxy-4-nitrophenyl)hydrazineylidene)-5-methyl-2-phenyl-2,4-dihydro-3H-pyrazol-3-one complexed with chromium

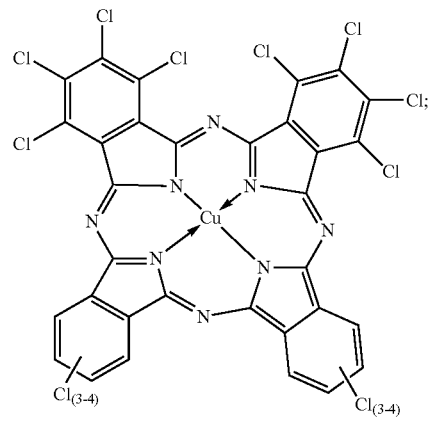

copper complex phthalocyanine

-continued

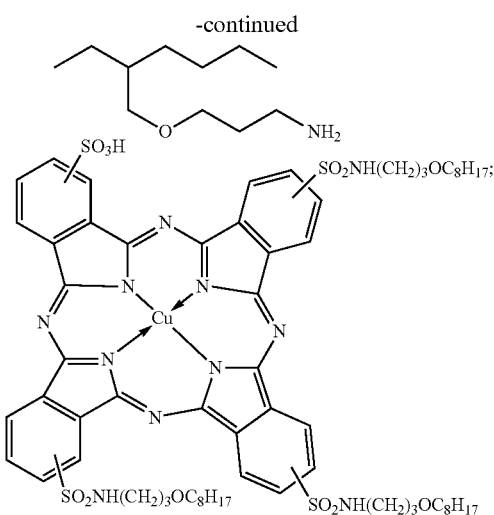

Cuprate(1-), [C,C,C-tris[[[3-[(2-ethylhexyl)oxy]propyl]-amino]sulfonyl]-29H,31H-phthalocyanine-C-sulfonato(3-)N29,N30,N31,N32]-, hydrogen, compound with 3-[(2-ethylhexyl)oxy]-1-propanamine (1:1)

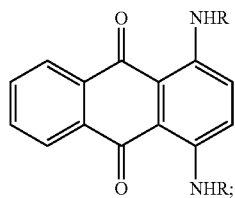

1,4-bis(alkylamino)anthra-cenedione, where R is methyl, ethyl, n-propyl, n-butyl, n-pentyl, 2-ethylhexyl, 3-((2-ethyl-hexyl)oxy)propyl), 3-methoxypropyl, phenyl, p-tolyl

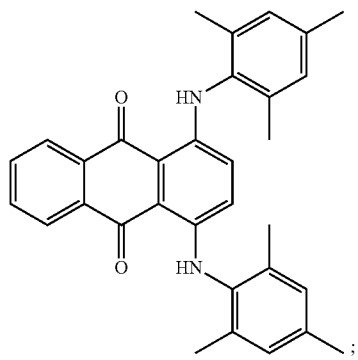

1,4-bis(mesitylamino)anthracene-9,10-dione

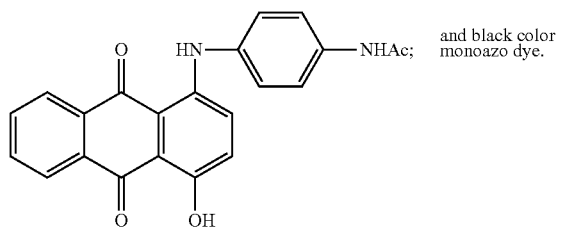

N-(4-((4-hydroxy-9,10-dioxo-9,10-dihydroanthracen-1-yl)amino)phenyl)acetamide and black color monoazo dye.

10. The composition of claim 1, wherein the photoactive compound comprises moiety selected from the group consisting of a 1,2-naphthoquinonediazide-5-sulfonyl moiety, a 1,2-naphtoquinonediazide-4-sulfonyl moiety as represented by structural formulae (IIIa) and (IIIb), respectively:

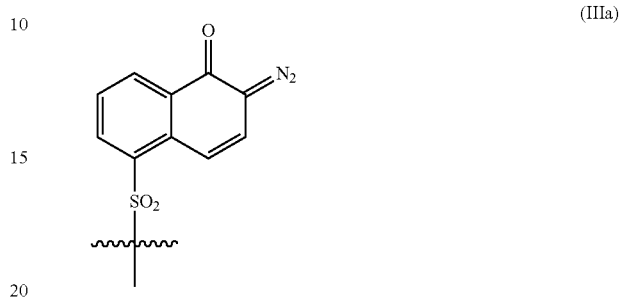
(IIIa)

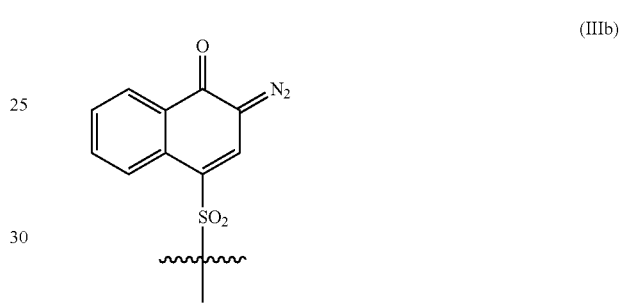
(IIIb)

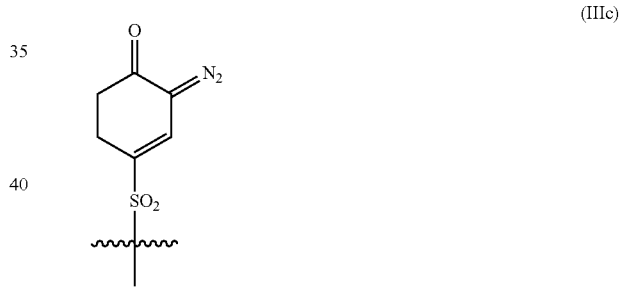
(IIIc)

and a sulfonyl benzoquinone diazide represented by structural formula (IIIc).

11. The composition according to claim 1, wherein the photoactive compound is

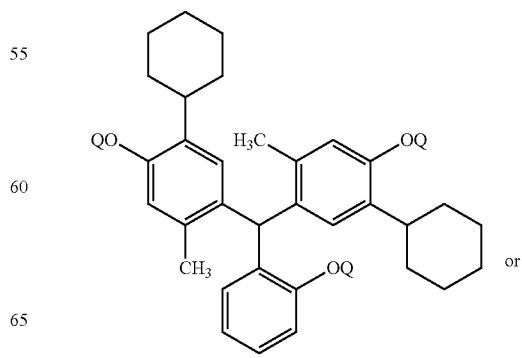

or

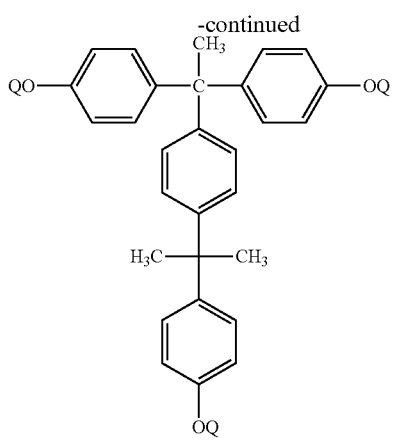

wherein at least one of Q is a group of formula (IIIa) or (IIIb):

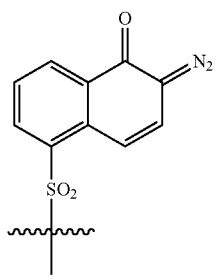
(IIIa)

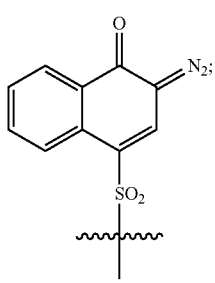
(IIIb)

and the remaining Q is hydrogen.

12. The composition according to claim 1, which further comprises one or more crosslinking agents selected from the group consisting of:

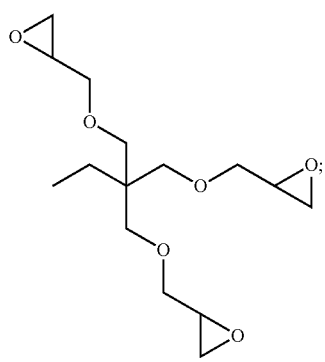

2,2'-(((2-ethyl-2-((oxiran-2-ylmethoxy)methyl)propane-1,3-diyl)bis(oxy))bis(methylene))bis(oxirane)

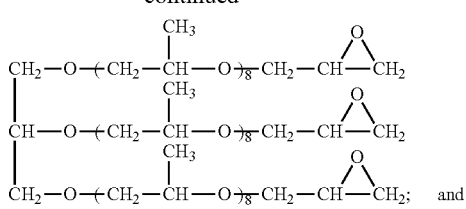

triglycidyl ether of poly(oxypropylene)epoxide ether of glycerol

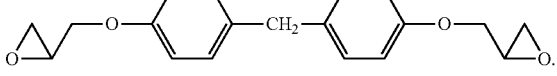

bis(4-(oxiran-2-ylmethoxy)phenyl)methane

13. The composition according to claim 1, wherein the solvent is selected from the group consisting of: propyleneglycol monomethylether acetate (PGMEA), gamma-butyrolactone (GBL) and N-methylpyrrolidone (NMP).

14. The composition according to claim 1, which further comprises one or more additives selected from the group consisting of:

dissolution promoters;

adhesion promoters;

antioxidants;

surfactants; and mixtures in any combination thereof.

15. An article comprising an array of microlens with color filter functionality, wherein said array comprises a composition according to claim 1.

16. The article according to claim 15, wherein the array is in a checkerboard configuration.

17. A method of forming a film for the fabrication of color filter-microlens array in a microelectronic or optoelectronic device comprising:

coating a suitable substrate with a composition according to claim 1 to form a film;

patterning the film with a mask by exposing to a suitable radiation;

developing the film after exposure to form a photopattern; and heating the patterned film to a suitable temperature to form an array of microlens.

18. A microlens arrays formed by the composition of claim 1.

19. An optoelectronic or microelectronic device comprising the microlens arrays of claim 18.

* * * * *